United States Patent
Schardt et al.

(10) Patent No.: US 11,144,357 B2
(45) Date of Patent: Oct. 12, 2021

(54) SELECTING HARDWARE ACCELERATORS BASED ON SCORE

(71) Applicant: International Business Machines Corporation, Armonk, NY (US)

(72) Inventors: Paul E. Schardt, Rochester, MN (US); Jim C. Chen, Rochester, MN (US); Lance G. Thompson, Rochester, MN (US); James E. Carey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 15/990,566

(22) Filed: May 25, 2018

(65) Prior Publication Data

US 2019/0361746 A1 Nov. 28, 2019

(51) Int. Cl.
*G06F 9/50* (2006.01)
*G06F 9/38* (2018.01)
*G06F 30/331* (2020.01)
*G06F 30/347* (2020.01)

(52) U.S. Cl.
CPC .......... *G06F 9/5044* (2013.01); *G06F 9/3877* (2013.01); *G06F 9/505* (2013.01); *G06F 9/5027* (2013.01); *G06F 9/5066* (2013.01); *G05B 2219/34024* (2013.01); *G06F 30/331* (2020.01); *G06F 30/347* (2020.01)

(58) Field of Classification Search
None
See application file for complete search history.

(56) References Cited

U.S. PATENT DOCUMENTS

| 8,869,160 B2* | 10/2014 | Dillenberger ......... G06F 9/5044 718/104 |
| 9,298,438 B2 | 3/2016 | Nightingale et al. |
| 9,424,019 B2 | 8/2016 | Nightingale et al. |

(Continued)

OTHER PUBLICATIONS

Kachris et al, A survey on Reconfigurable Accelerators for Cloud Computing, 2016 (Year: 2016).*

(Continued)

*Primary Examiner* — Abu Zar Ghaffari
(74) *Attorney, Agent, or Firm* — Aaron N. Pontikos

(57) ABSTRACT

Hardware accelerators are scored according to various metrics and attributes that characterize the accelerators. Examples of suitable accelerator scoring criteria include whether the software simulation of the accelerator is complete, whether hardware testing is complete, whether the accelerator is currently deployed, the number of times the accelerator has been deployed to a private cloud, the number of times the accelerator has been deployed to a public cloud, ratings by users, number of failures, number of executions, space utilization and efficiency, code metrics, power consumption, speed, and image characteristics, including space used, resources used, use of dedicated functions on a programmable device, etc. These accelerator scoring criteria are tracked for each accelerator in an accelerator scoring catalog. When an accelerator is needed, accelerator selection criteria is specified and compared with the accelerator scoring criteria in the accelerator scoring catalog to locate one or more accelerators that satisfy the accelerator selection criteria.

8 Claims, 19 Drawing Sheets

(56) References Cited

U.S. PATENT DOCUMENTS

| | | | |
|---|---|---|---|
| 9,501,439 B1 | 11/2016 | Fredrickson | |
| 9,600,618 B2 | 3/2017 | Greenwood et al. | |
| 9,606,836 B2* | 3/2017 | Burger | G06F 9/5027 |
| 9,607,120 B2 | 3/2017 | Greenwood et al. | |
| 10,164,639 B1 | 12/2018 | Roberts et al. | |
| 10,713,072 B1* | 7/2020 | Burgin | H04L 41/0806 |
| 10,892,944 B2 | 1/2021 | Schardt | |
| 2003/0222876 A1* | 12/2003 | Giemborek | G06F 1/325 |
| | | | 345/503 |
| 2005/0220093 A1 | 10/2005 | Chen | |
| 2008/0244126 A1* | 10/2008 | Hundley | G06F 9/4843 |
| | | | 710/104 |
| 2011/0161630 A1* | 6/2011 | Raasch | G06F 9/30196 |
| | | | 712/205 |
| 2011/0320523 A1 | 12/2011 | Chan et al. | |
| 2012/0265569 A1* | 10/2012 | Gonzalez-Diaz | |
| | | | G06Q 10/0631 |
| | | | 705/7.12 |
| 2013/0061033 A1* | 3/2013 | Kim | G06F 9/3877 |
| | | | 713/100 |
| 2013/0132616 A1* | 5/2013 | Worthington | G06F 11/3485 |
| | | | 710/18 |
| 2013/0152099 A1* | 6/2013 | Bass | G06F 9/5027 |
| | | | 718/103 |
| 2013/0305199 A1* | 11/2013 | He | G06F 30/34 |
| | | | 716/104 |
| 2014/0380025 A1 | 12/2014 | Kruglick | |
| 2016/0196221 A1* | 7/2016 | Wan | G06F 13/1642 |
| | | | 710/310 |
| 2016/0321113 A1* | 11/2016 | Pinto | G06F 9/45533 |
| 2017/0017523 A1* | 1/2017 | Guccione | G06F 9/5044 |
| 2017/0060606 A1 | 3/2017 | Hollinger | |
| 2017/0078148 A1 | 3/2017 | Matsumoto | |
| 2018/0088174 A1 | 3/2018 | Davis et al. | |
| 2018/0143854 A1* | 5/2018 | Kumar | G06F 9/505 |
| 2018/0150330 A1* | 5/2018 | Bernat | G06F 8/658 |
| 2018/0157533 A1* | 6/2018 | Adachi | G06F 9/5027 |
| 2018/0246770 A1* | 8/2018 | Yu | G06F 9/5011 |
| 2018/0357098 A1* | 12/2018 | Dube | G06F 9/5005 |
| 2019/0042269 A1 | 2/2019 | Pearce et al. | |
| 2019/0042522 A1* | 2/2019 | Peleska | H04W 52/02 |
| 2019/0050248 A1* | 2/2019 | Oohira | G06F 9/5077 |
| 2019/0056942 A1* | 2/2019 | Chen | G06F 15/82 |
| 2019/0087606 A1 | 3/2019 | Subhaschandra et al. | |
| 2019/0156387 A1 | 5/2019 | Kruglick | |
| 2019/0250210 A1* | 8/2019 | Sun | G01R 31/318364 |
| 2019/0250957 A1* | 8/2019 | Hatasaki | G06F 9/4881 |
| 2019/0296964 A1* | 9/2019 | Nambiar | H04L 69/161 |
| 2019/0347125 A1* | 11/2019 | Sankaran | G06F 9/3877 |
| 2020/0045054 A1* | 2/2020 | Yang | H04L 61/1511 |
| 2020/0050401 A1 | 2/2020 | Gibb | |
| 2020/0057685 A1 | 2/2020 | Schardt | |
| 2021/0073047 A1* | 3/2021 | Bhandaru | H04L 41/0893 |

OTHER PUBLICATIONS

Shimoda et al., Protein-protien docking on hardware accelerators: comparison of GPU and MIC architecture, 2015, BMC (Year: 2015).*

SAS scoring Accelerator: High Performance model scoring and deployment with faster time to result, 2018 (Year: 2018).*

Schardt et al., "Automatically Deploying Hardware Accelerators Based on Requests From Users" U.S. Appl. No. 16/102,750, filed Aug. 14, 2018.

Schardt et al., "Selecting and Using a Cloud-Based Hardware Accelerator" U.S. Appl. No. 16/205,124, filed Nov. 29, 2018.

IBM, Appendix P—List of IBM Patents or Patent Applications Treated As Related, dated Jan. 28, 2019.

Schardt et al., "Selecting and Using a Cloud-Based Hardware Accelerator" U.S. Appl. No. 17/128,041, filed Dec. 19, 2020.

Stuecheli et al., "CAPI: A Coherent Accelerator Processor Interface", IBM Journal of Research and Development. 59.7:1-7:7. 10.1147/JRD.2014.2380198, 2015, within Office Action for U.S. Appl. No. 16/102,750 dated Dec. 9, 2020.

List of IBM Patents or Patent Applications Treated as Related, Filed May 14, 2021, 2 pages.

* cited by examiner

| Accelerator Catalog 1000 | | | | | | | | | |
|---|---|---|---|---|---|---|---|---|---|
| Name | Location | LRU | MRU | Error Rate | Dependencies | Capabilities | Latency | Other Characteristic(s) |
| Acc1 | <path> | <time> | <time> | X/100 runs | Acc2 | FP Unit | 1.0 us | Includes NW connection |
| ... | ... | ... | ... | ... | ... | ... | ... | ... |
| AccN | <path> | <time> | <time> | Y/100 runs | None | Graphics | 500 ns | Affinity to Acc5 |

FIG. 10

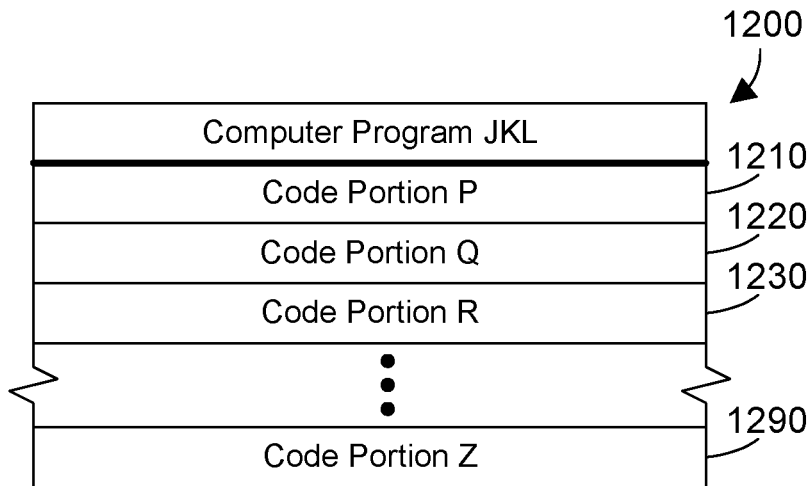
FIG. 12
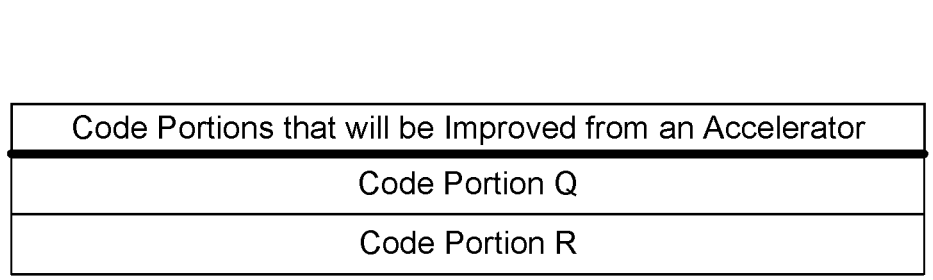
FIG. 13
FIG. 14

| Accelerator Catalog ||||||
|---|---|---|---|---|---|
| Name | Location | LRU | MRU | Error Rate | Dependencies |
| AccQ | <path> | <time> | <time> | X/100 runs | None |
| AccR | <path> | <time> | <time> | X/100 runs | None |

| Accelerator Scoring Catalog ||||||||||||||
| Name | F | SC | HTC | Dep | # Priv | # Pub | Rtgs | Fails | Exec | Eff | Code | Pwr | Speed | Img |
|---|---|---|---|---|---|---|---|---|---|---|---|---|---|---|
| Acc1 | F1 | Y | N | N | 0 | 0 | 0 | 0 | 0 | 21 | 0 | P1 | S3 | I1 |
| Acc2 | F2 | Y | Y | N | 2 | 0 | 0 | 1 | 36 | 42 | 0 | P2 | S2 | I2 |
| Acc3 | F1 | Y | Y | Y | 4 | 18 | 3.5 | 1 | 17 | 19 | 0 | P3 | S1 | I3 |
| Acc4 | F3 | Y | Y | Y | 3 | 2 | 3.2 | 0 | 1543 | 83 | Attr1 | P2 | S4 | I4 |
| Acc5 | F4 | Y | Y | N | 0 | 23 | 4.8 | 0 | 124 | 25 | 0 | P1 | S1 | I5 |
| Acc6 | F2 | Y | Y | Y | 17 | 2 | 1.5 | 0 | 341 | 64 | 0 | P1 | S2 | I6 |
| Acc7 | F4 | Y | Y | N | 0 | 0 | 2.1 | 0 | 0 | 57 | 0 | P4 | S4 | I7 |
| Acc8 | F3 | Y | Y | Y | 5 | 3 | 4.3 | 26 | 147 | 91 | 0 | P4 | S1 | I8 |
| Acc9 | F1 | Y | Y | Y | 1 | 0 | 3.6 | 0 | 55 | 77 | 0 | P3 | S2 | I9 |

FIG. 28

| Accelerator Selection Criteria |
|---|
| F=1, SC=YES, HTC=YES, Dep=YES, # Priv > 3, Fails < 10%, Executions>10 |

Result Set
Acc3

FIG. 29

| Accelerator Selection Criteria |
|---|
| F=4, Dep=YES, # Total (Priv+Pub) > 10, Executions>100 |

Result Set
<none>

FIG. 30

| Accelerator Selection Criteria |
|---|
| F=3, Dep=YES, # Priv > 1, # Pub > 1, Fails < 10%, Executions>100 |

Result Set
Acc4

FIG. 31

| Accelerator Selection Criteria |
|---|
| F=2, # Pub > 1, Fails = 0, Executions>100, Pwr < P3 |

Result Set
Acc6

FIG. 32

| Accelerator Selection Criteria |
|---|
| F=1, # Priv > 1, Fails <10%, Executions>10, Speed = S1 or S2 |

Result Set
Acc3
Acc9

FIG. 33

SELECTING HARDWARE ACCELERATORS BASED ON SCORE

BACKGROUND

1. Technical Field

This disclosure generally relates to computer systems, and more specifically relates to hardware accelerators in computer systems.

2. Background Art

The Open Coherent Accelerator Processor Interface (OpenCAPI) is a specification developed by a consortium of industry leaders. The OpenCAPI specification defines an interface that allows any processor to attach to coherent user-level accelerators and I/O devices. OpenCAPI provides a high bandwidth, low latency open interface design specification built to minimize the complexity of high-performance accelerator design. Capable of 25 gigabits (Gbits) per second per lane data rate, OpenCAPI outperforms the current peripheral component interconnect express (PCIe) specification which offers a maximum data transfer rate of 16 Gbits per second per lane. OpenCAPI provides a data-centric approach, putting the compute power closer to the data and removing inefficiencies in traditional system architectures to help eliminate system performance bottlenecks and improve system performance. A significant benefit of OpenCAPI is that virtual addresses for a processor can be shared and utilized in an OpenCAPI device, such as an accelerator, in the same manner as the processor. With the development of OpenCAPI, hardware accelerators may now be developed that include an OpenCAPI architected interface.

BRIEF SUMMARY

Hardware accelerators currently deployed to programmable devices or previously deployed to programmable devices are scored according to various metrics and attributes that characterize the accelerators. Examples of suitable accelerator scoring criteria include whether the software simulation of the accelerator is complete, whether hardware testing is complete, whether the accelerator is currently deployed, the number of times the accelerator has been deployed to a private cloud, the number of times the accelerator has been deployed to a public cloud, ratings by users, number of failures, number of executions, space utilization and efficiency, code metrics, power consumption, speed, and image characteristics, including space used, resources used, use of dedicated functions on a programmable device, etc. These accelerator scoring criteria are tracked for each accelerator in an accelerator scoring catalog. When an accelerator is needed, accelerator selection criteria is specified and compared with the accelerator scoring criteria in the accelerator scoring catalog to locate one or more accelerators that satisfy the accelerator selection criteria.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

FIG. 10 is a block diagram showing a sample accelerator catalog;

FIG. 12 is a block diagram showing a second sample computer program with different code portions;

FIG. 13 is a block diagram identifying two code portions in the computer program in FIG. 12 that would benefit from an accelerator;

FIG. 14 is a block diagram showing a sample accelerator catalog that includes an accelerator that corresponds to code portion Q;

FIG. 28 is a sample accelerator scoring catalog showing some samples of accelerators and sample scores for these sample accelerators;

FIG. 29 shows first accelerator selection criteria and the corresponding result set when the accelerator selection criteria are applied to the accelerator scoring catalog in FIG. 28;

FIG. 30 shows second accelerator selection criteria and the corresponding result set when the accelerator selection criteria are applied to the accelerator scoring catalog in FIG. 28;

FIG. 31 shows third accelerator selection criteria and the corresponding result set when the accelerator selection criteria are applied to the accelerator scoring catalog in FIG. 28;

FIG. 32 shows fourth accelerator selection criteria and the corresponding result set when the accelerator selection criteria are applied to the accelerator scoring catalog in FIG. 28; and FIG. 33 shows fifth accelerator selection criteria and the corresponding result set when the accelerator selection criteria are applied to the accelerator scoring catalog in FIG. 28.

DETAILED DESCRIPTION

Figure 1:
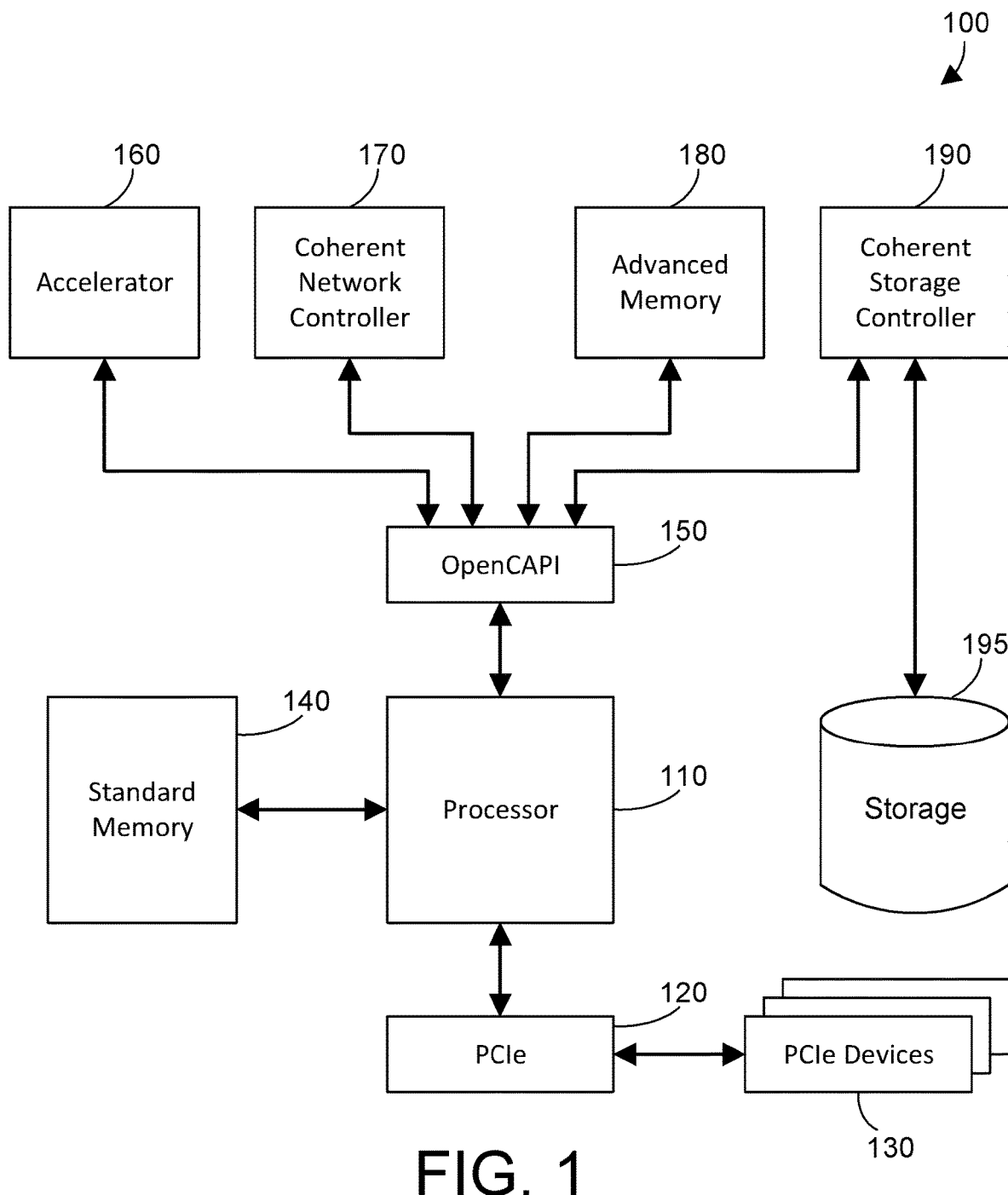
FIG. 1 is a block diagram of a sample system illustrating how an Open Coherent Accelerator Processor Interface (OpenCAPI) can be used.

As discussed in the Background Art section above, the Open Coherent Accelerator Processor Interface (OpenCAPI) is a specification that defines an interface that allows any processor to attach to coherent user-level accelerators and I/O devices. Referring to FIG. 1, a sample computer system 100 is shown to illustrate some of the concepts related to the OpenCAPI interface 150. A processor 110 is coupled to a standard memory 140 or memory hierarchy, as is known in the art. The processor is coupled via a PCIe interface 120 to one or more PCIe devices 130. The processor 110 is also coupled via an OpenCAPI interface 150 to one or more coherent devices, such as accelerator 160, coherent network controller 170, advanced memory 180, and coherent storage controller 190 that controls data stored in storage 195. While the OpenCAPI interface 150 is shown as a separate entity in FIG. 1 for purposes of illustration, instead of being a separate interface as shown in FIG. 1, the OpenCAPI interface 150 can be implemented within each of the coherent devices. Thus, accelerator 160 may have its own OpenCAPI interface, as may the other coherent devices 170, 180 and 190. One of the significant benefits of OpenCAPI is that virtual addresses for the processor 110 can be shared with coherent devices that are coupled to or include an OpenCAPI interface, permitting them to use the virtual addresses in the same manner as the processor 110.

Figure 2:
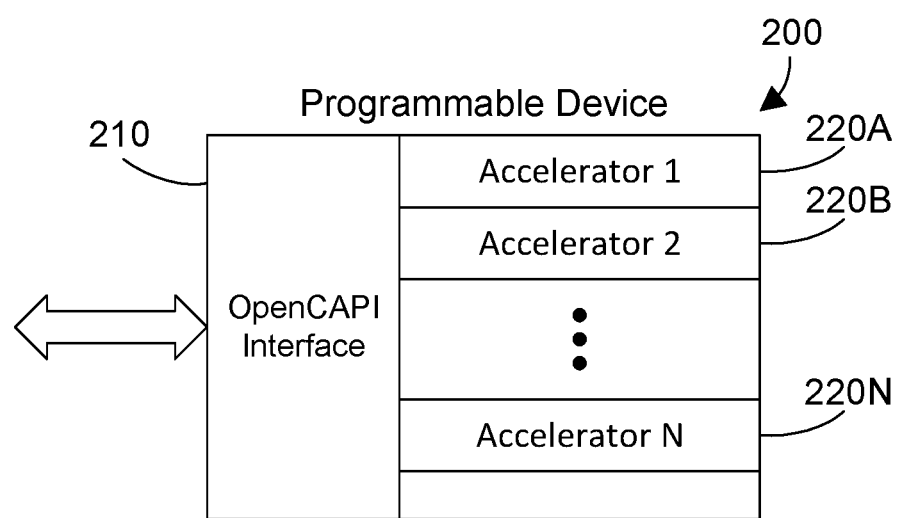
FIG. 2 is a flow diagram of a programmable device with an OpenCAPI interface that may include one or more hardware accelerators.

Referring to FIG. 2, a programmable device 200 represents any suitable programmable device. For example, the programmable device 200 could be an FPGA or an ASIC. An OpenCAPI interface 210 can be implemented within the programmable device. In addition, one or more accelerators can be implemented in the programmable device 200. FIG. 1 shows by way of example accelerator 1 220A, accelerator 2 220B, . . . , accelerator N 220N. In the prior art, a human designer would determine what type of accelerator is needed based on a function that needs to be accelerated by being implemented in hardware. The accelerator function could be represented, for example, in a hardware description language (HDL). Using known tools, the human designer can then generate an accelerator image that corresponds to the HDL. The accelerator image, once loaded into the programmable device such as 200 in FIG. 2, creates an accelerator in the programmable device that may be called as needed by one or more computer programs to provide the hardware accelerator(s).

Hardware accelerators currently deployed to programmable devices or previously deployed to programmable devices are scored according to various metrics and attributes that characterize the accelerators. Examples of suitable accelerator scoring criteria include whether the software simulation of the accelerator is complete, whether hardware testing is complete, whether the accelerator is currently deployed, the number of times the accelerator has been deployed to a private cloud, the number of times the accelerator has been deployed to a public cloud, ratings by users, number of failures, number of executions, space utilization and efficiency, code metrics, power consumption, speed, and image characteristics, including space used, resources used, use of dedicated functions on a programmable device, etc. These accelerator scoring criteria are tracked for each accelerator in an accelerator scoring catalog. When an accelerator is needed, accelerator selection criteria is specified and compared with the accelerator scoring criteria in the accelerator scoring catalog to locate one or more accelerators that satisfy the accelerator selection criteria.

Figure 3:
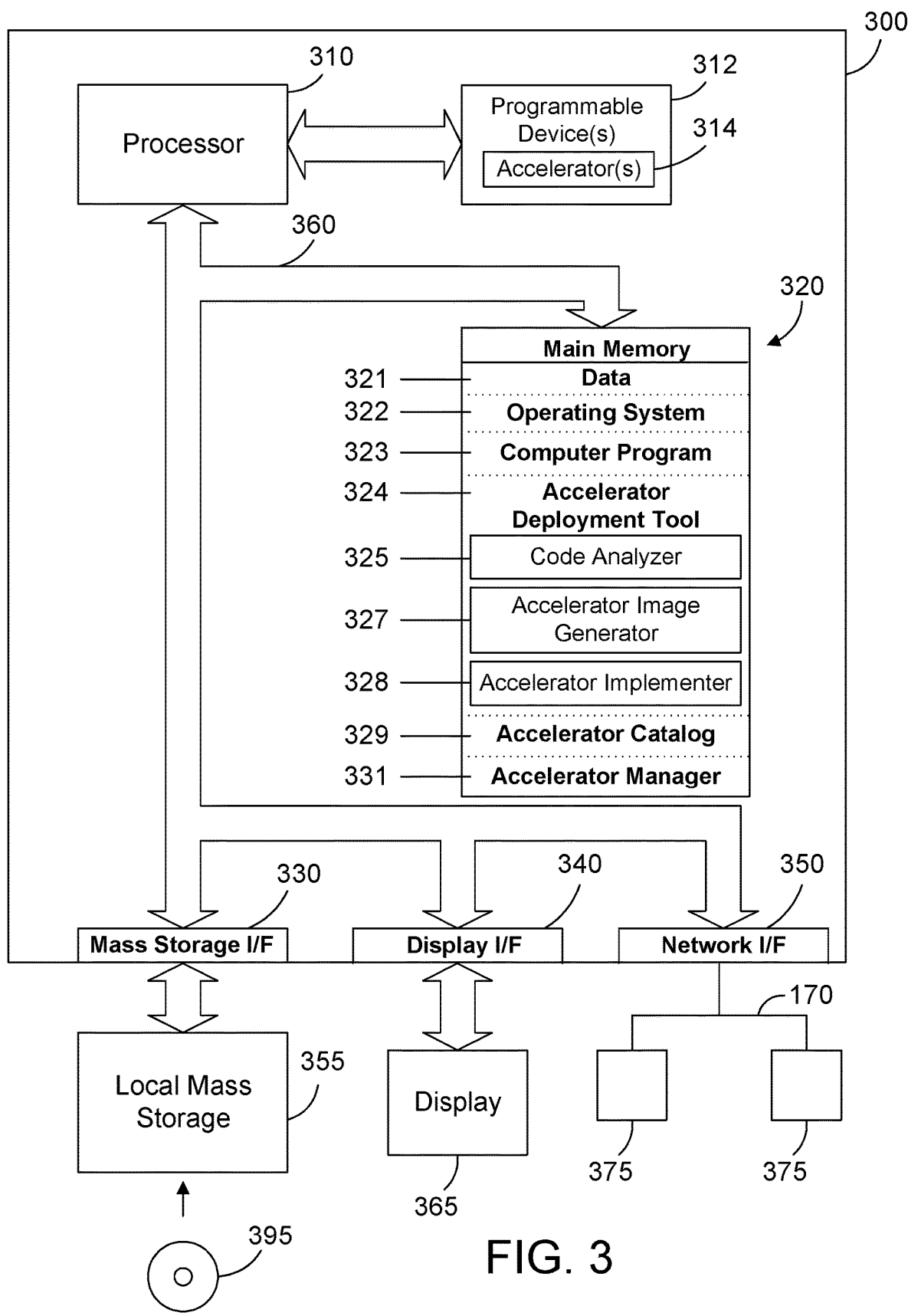
FIG. 3 is a block diagram of a computer system that includes a tool for managing accelerators.

Referring to FIG. 3, a computer system 300 is one suitable implementation of a computer system that includes an accelerator manager as described in more detail below. Server computer system 300 is an IBM POWER9 computer system. However, those skilled in the art will appreciate that the disclosure herein applies equally to any computer system, regardless of whether the computer system is a complicated multi-user computing apparatus, a single user workstation, a laptop computer system, a tablet computer, a phone, or an embedded control system. As shown in FIG. 3, computer system 300 comprises one or more processors 310, one or more programmable devices 312, a main memory 320, a mass storage interface 330, a display interface 340, and a network interface 350. These system components are interconnected through the use of a system bus 360. Mass storage interface 330 is used to connect mass storage devices, such as local mass storage device 355, to computer system 300. One specific type of local mass storage device 355 is a readable and writable CD-RW drive, which may store data to and read data from a CD-RW 395. Another suitable type of local mass storage device 355 is a card reader that receives a removable memory card, such as an SD card, and performs reads and writes to the removable memory. Yet another suitable type of local mass storage device 355 is universal serial bus (USB) that reads a storage device such a thumb drive.

Main memory 320 preferably contains data 321, an operating system 322, a computer program 323, an accelerator deployment tool 324, an accelerator catalog 329, and an accelerator manager 331. Data 321 represents any data that serves as input to or output from any program in computer system 300. Operating system 322 is a multitasking operating system, such as AIX or LINUX. Computer program 323 represents any suitable computer program, including without limitations an application program, an operating system, firmware, a device driver, etc. The accelerator deployment tool 324 preferably includes a code analyzer 325, an accelerator image generator 327, and an accelerator implementer 328. The code analyzer 325 analyzes the computer program 324 as it runs to determine its run-time performance. One suitable way for code analyzer 325 to analyze the computer program is using known techniques for monitoring the run-time performance of a computer program. For example, tools exist in the art that allow real-time monitoring of the run-time performance of a computer program using a monitor external to the computer program that detects, for example, which addresses are being executed by the processor 310 during the execution of the computer program 323. Other tools known as profilers allow inserting instrumentation code into a computer program, which is code that increments different counters when different branches of the computer program are executed. The values of the counters can be analyzed to determine the frequency of executing each portion of the computer program. The code analyzer 325, after analyzing the run-time performance of the computer program, identifies a code portion, which is a portion of code in the computer program 323, that will be improved from being deployed to a hardware accelerator to enhance the run-time performance of the computer program 323.

The accelerator image generator 327 dynamically generates an accelerator image corresponding to the code portion in the computer program 323 identified by the code analyzer 325. The code portion in the computer program 323 is shown as code portion 326 in FIGS. 4 and 5. The accelerator image generator 327 may generate an accelerator image from the code portion using any suitable method. For example, the accelerator image generator 327 could generate an equivalent hardware description language (HDL) representation of the code portion, then synthesize the HDL representation into a suitable accelerator image for the programmable device 312. The accelerator implementer 328 preferably takes an accelerator image generated by the accelerator image generator 327, and uses the accelerator image to program the programmable device 312, thereby generating a hardware accelerator 314 in a programmable device 312 that corresponds to the code portion.

In a first implementation, the accelerator deployment tool 324 dynamically generates an accelerator image corresponding to the code portion of the computer program 323, then programs the programmable device with the accelerator image so the programmable device includes a hardware accelerator that corresponds to the code portion. In a second implementation, an accelerator catalog 329 is provided and maintained. The accelerator catalog 329 preferably includes a listing of previously-generated accelerators. In the second implementation, the accelerator deployment tool 324 first checks the accelerator catalog 329 to see if a previously-generated accelerator is available for the code portion. If so, the accelerator deployment tool 324 deploys a previously generated accelerator image identified in the accelerator catalog. If not, the accelerator deployment tool 324 dynamically generates an accelerator image as described above, then loads the image into a programmable device 312 to provide the accelerator 314 that corresponds to the code portion.

The accelerator manager 331 manages accelerators after they are running and being called by one or more computer programs, such as software applications. The accelerator manager 331 monitors usage of accelerators by computer programs, and can select and call an accelerator using acceleration selection criteria. The function of the accelerator manager is discussed in more detail below with respect to FIGS. 24-33.

Computer system 300 utilizes well known virtual addressing mechanisms that allow the programs of computer system 300 to behave as if they only have access to a large, contiguous address space instead of access to multiple, smaller storage entities such as main memory 320 and local mass storage device 355. Therefore, while data 321, operating system 322, computer program 323, accelerator deployment tool 324, accelerator catalog 329 and accelerator manager 331 are shown to reside in main memory 320, those skilled in the art will recognize that these items are not necessarily all completely contained in main memory 320 at the same time. It should also be noted that the term "memory" is used herein generically to refer to the entire virtual memory of computer system 300, and may include the virtual memory of other computer systems coupled to computer system 300.

Processor 310 may be constructed from one or more microprocessors and/or integrated circuits. Processor 310 could be, for example, one or more POWER9 microprocessors. Processor 310 executes program instructions stored in main memory 320. Main memory 320 stores programs and data that processor 310 may access. When computer system 300 starts up, processor 310 initially executes the program instructions that make up operating system 322. Processor 310 also executes the computer program 323, the accelerator deployment tool 324 and the accelerator manager 331.

Programmable device(s) 312 can be any suitable programmable logic device that can be dynamically programmed by the processor 310. Examples of known suitable programmable logic devices include field-programmable gate arrays (FPGAs). However, the programmable device 312 broadly includes any programmable logic device that allows the processor 310 to dynamically program the programmable device 312, including known technologies as well as technologies that are developed in the future.

Although computer system 300 is shown to contain only a single processor and a single system bus, those skilled in the art will appreciate that an accelerator manager as described herein may be practiced using a computer system that has multiple processors and/or multiple buses. In addition, the interfaces that are used preferably each include separate, fully programmed microprocessors that are used to off-load compute-intensive processing from processor 310. However, those skilled in the art will appreciate that these functions may be performed using I/O adapters as well.

Display interface 340 is used to directly connect one or more displays 365 to computer system 300. These displays 365, which may be non-intelligent (i.e., dumb) terminals or fully programmable workstations, are used to provide system administrators and users the ability to communicate with computer system 300. Note, however, that while display interface 340 is provided to support communication with one or more displays 365, computer system 300 does not necessarily require a display 365, because all needed interaction with users and other processes may occur via network interface 350.

Network interface 350 is used to connect computer system 300 to other computer systems or workstations 375 via network 370. Computer systems 375 represent computer systems that are connected to the computer system 300 via the network interface 350. Network interface 350 broadly represents any suitable way to interconnect electronic devices, regardless of whether the network 370 comprises present-day analog and/or digital techniques or via some networking mechanism of the future. Network interface 350 preferably includes a combination of hardware and software that allows communicating on the network 370. Software in the network interface 350 preferably includes a communication manager that manages communication with other computer systems 375 via network 370 using a suitable network protocol. Many different network protocols can be used to implement a network. These protocols are specialized computer programs that allow computers to communicate across a network. TCP/IP (Transmission Control Protocol/Internet Protocol) is an example of a suitable network protocol that may be used by the communication manager within the network interface 350. In one suitable implementation, the network interface 350 is a physical Ethernet adapter.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
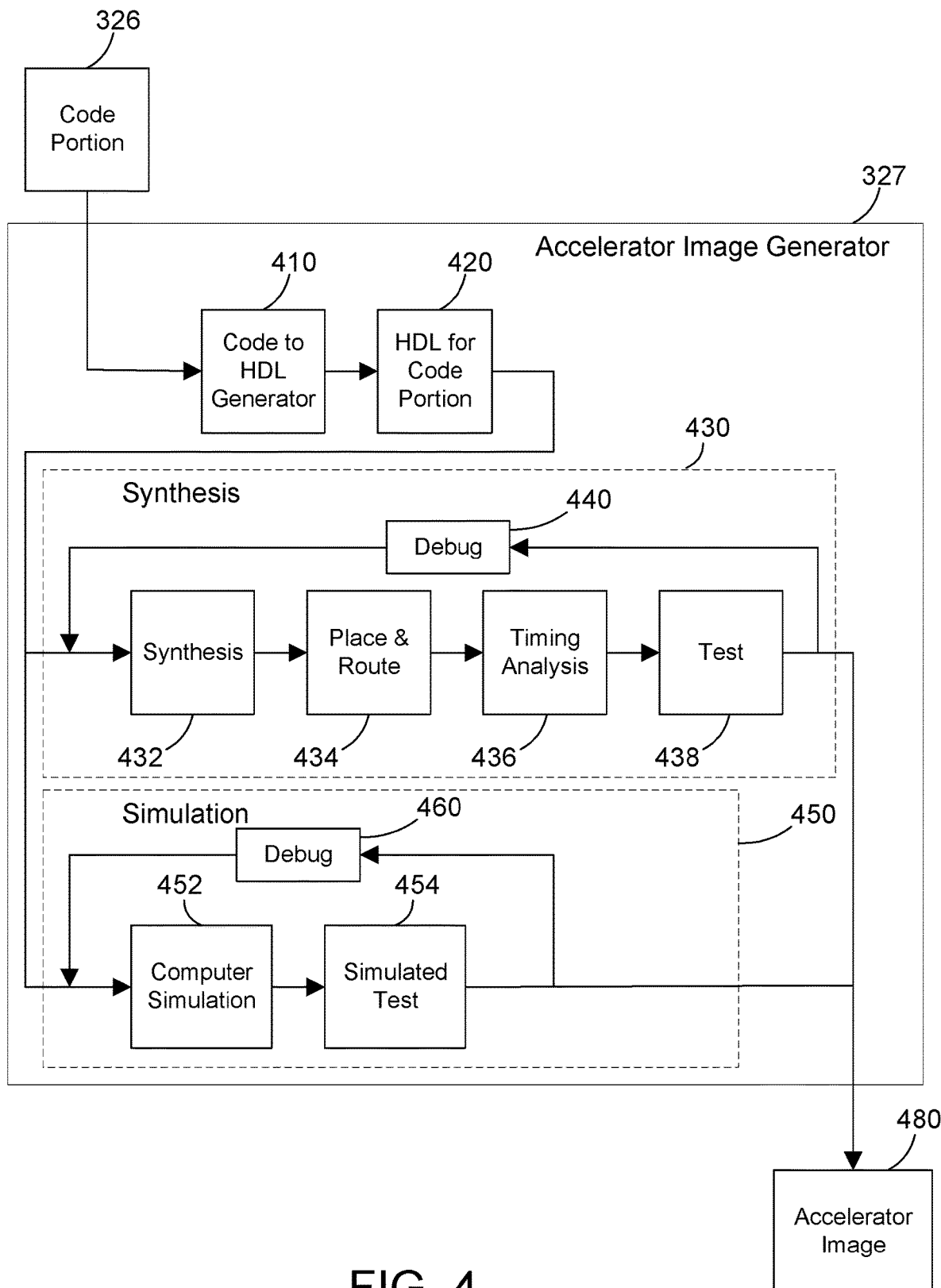
FIG. 4 is a flow diagram showing a specific implementation for how the accelerator image generator in FIG. 3 generates an accelerator image from a code portion.

FIG. 4 illustrates details of one suitable implementation of the accelerator image generator 327 shown in FIG. 3. The accelerator image generator 327 takes as input the code portion 326 shown in FIG. 4. A code to HDL generator 410 preferably converts the code portion 326 to a corresponding representation of the code portion in a hardware description language (HDL), shown in FIG. 4 as HDL for code portion 420. Known suitable hardware description languages include VHDL or Verilog, but any suitable hardware description language could be used. There are known software tools for generating an HDL representation of computer code. For example, Xilinx's Vivado High Level Synthesis is a software tool that converts code written in the C programming language to HDL. This type of tool is often referred to in the art as a "C to HDL" tool or a "C to RTL" tool, where RTL refers to the Register Transfer Level representation of a code portion needed to implement the code portion in hardware. The Code to HDL Generator 410 in FIG. 4 could be a known software tool, or could be a software tool specifically designed for the accelerator image generator 327.

The HDL for the code portion 420 is fed into one or more processes that may include both synthesis and simulation. The synthesis process 430 is shown in the middle portion of FIG. 4 in steps 432, 434, 436, 438 and 440. The simulation process 450 is shown in the lower portion of FIG. 4 in steps 452, 454 and 460. The HDL for code portion 420 may be fed into the synthesis block 432, which determines which hardware elements are needed. The place and route block 434 determines where on the programmable device to put the hardware elements, and how to route interconnections between those hardware elements. Timing analysis 436 analyzes the performance of the accelerator after the hardware elements have been placed and interconnections have been routed in block 434. Test block 438 runs tests on the resulting accelerator image to determine whether timing and performance parameters are satisfied. The test block 438 feeds back to debug block 440 when the design of the accelerator still needs improvement. This process may iterate several times.

The simulation process 450 takes in the HDL for the code portion 420, and performs a computer simulation to determine its functionality. A simulated test block 454 determines whether the simulated design functions as needed. The simulated test block 454 feeds back to a debug block 460 when the design of the accelerator still needs improvement.

The accelerator image generator 327 may include either the synthesis block 430, the simulation block 450, or both. In the most preferred implementation, the accelerator image generator 327 includes both the synthesis block 430 and the simulation block 450. The synthesis process can be very time-consuming. The simulation block is typically much faster in testing the design of the HDL than the synthesis block. When both synthesis 430 and simulation 450 are both present, the accelerator image generator can use both of these in any suitable way or combination. For example, the simulation block 450 could be used initially to iterate a few times on the design, and when the design is mostly complete, the mostly-completed design could be fed into the synthesis block 430. In another implementation, the synthesis and simulation blocks could function in parallel and cooperate until the generation of the accelerator image is complete. Regardless of the specific process used, the accelerator image generator 327 generates for the code portion 326 an accelerator image 480 that corresponds to the code portion 326. Once the accelerator image 480 has been generated, the accelerator implementer 328 in FIG. 3 can load the accelerator image 480 into a programmable device 312 to produce an accelerator 314 corresponding to the code portion 326. The accelerator 314 in the programmable device 312 may then be called by the computer program in place of the code portion 326.

Figure 5:
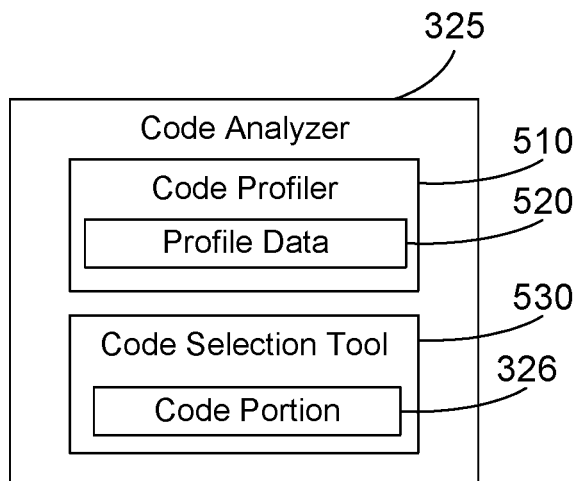
FIG. 5 is a block diagram of a specific implementation for the code analyzer in FIG. 3 that analyzes a computer program and selects a code portion.

Some details of one possible implementation for the code analyzer 325 in FIG. 3 are shown in FIG. 5. The code analyzer 325 can include a code profiler 510 that is used to profile the computer program. Profiling is done by the code profiler 510 preferably inserting instrumentation code into the computer program to generate profile data 520 as the computer program runs. The profile data 520 indicates many possible features of the computer program, including the frequency of executing different portions, the number or loop iterations, exceptions generated, data demand, bandwidth, time spent in a critical portion, etc. Software profilers are very well-known in the art, and are therefore not discussed in more detail here. For our purposes herein, suffice it to say the code profiler 510 generates profile data 520 that indicates run-time performance of the computer program being profiled.

The code analyzer 325 additionally includes a code selection tool 530 that identifies a code portion 326 that will be improved from being implemented in a hardware accelerator. Any suitable code portion could be identified according to any suitable criteria, algorithm or heuristic. For example, a portion of the code that performs floating-point calculations could be identified so that a corresponding floating-point accelerator could be generated to perform the floating-point calculations in the code. A portion of the code that performs a search of a database could be identified so a corresponding database search accelerator could be generated to replace the database search. A portion of the code that performs a specific function, such as data compression, XML parsing, packet snooping, financial risk calculations, etc., could also be identified. Of course, other code portions could be identified within the scope of the disclosure and claims herein. The code selection tool 530 can use any suitable criteria, algorithm or heuristic, whether currently known or developed in the future, to identify code portion 326. Once the code portion 326 in the computer program has been identified, a corresponding accelerator may be dynamically generated.

Figure 6:
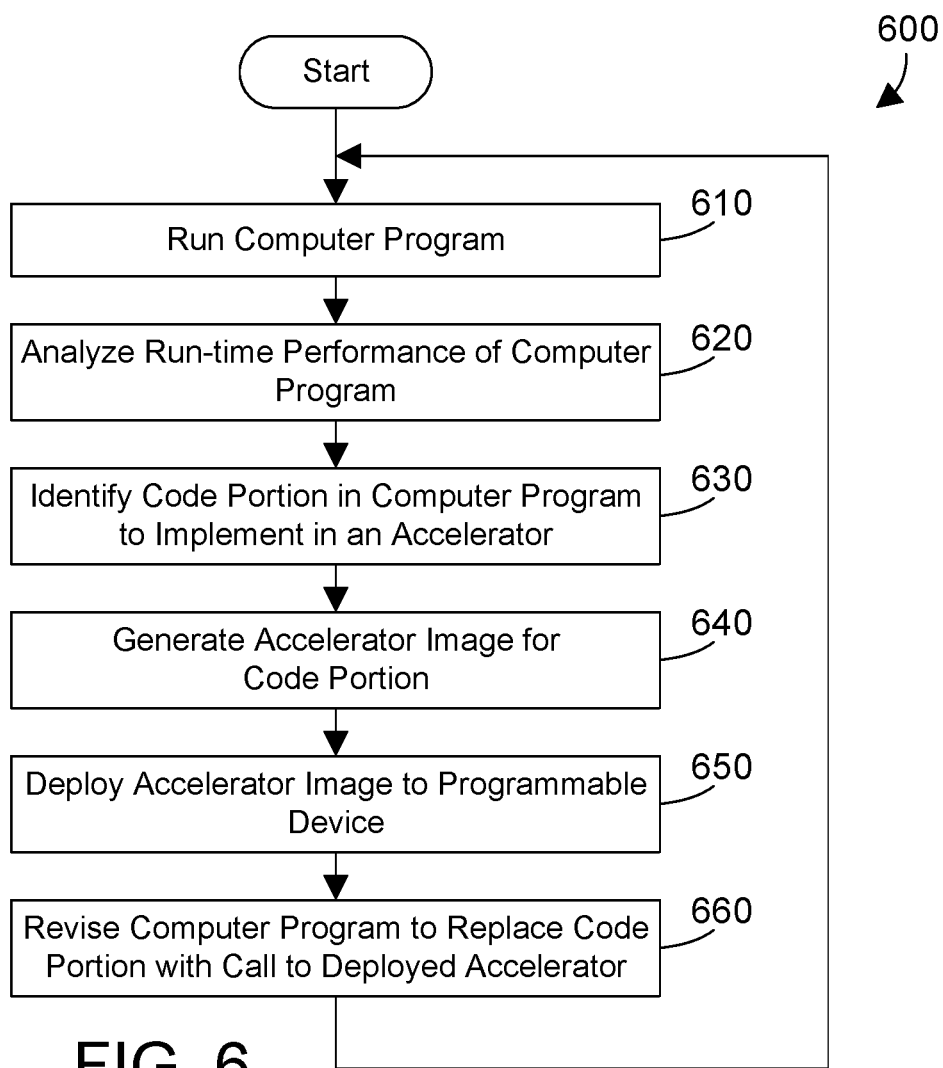
FIG. 6 is a flow diagram of a method for identifying a code portion in a computer program, dynamically generating and deploying an accelerator that corresponds to the code portion, then revising the computer program to replace the code portion with a call to the deployed accelerator.

Referring to FIG. 6, a method 600 starts by running the computer program (step 610). The run-time performance of the computer program is analyzed (step 620). This can be done, for example, by the code analyzer 325 shown in FIGS. 3 and 5 and discussed above. A code portion in the computer program is identified to implement in an accelerator (step 630). An accelerator image for the code portion is generated (step 640). The accelerator image is deployed to a programmable device (step 650). The computer program is then revised to replace the code portion with a call to the deployed accelerator (step 660). At this point, the deployed accelerator will perform the functions in hardware that were previously performed by the code portion, thereby improving the run-time performance of the computer program. Note that method 600 loops back to step 610 and continues, which means method 600 can iterate to continuously monitor the computer program and deploy accelerators, as needed, to improve performance of the computer program.

Figure 7:
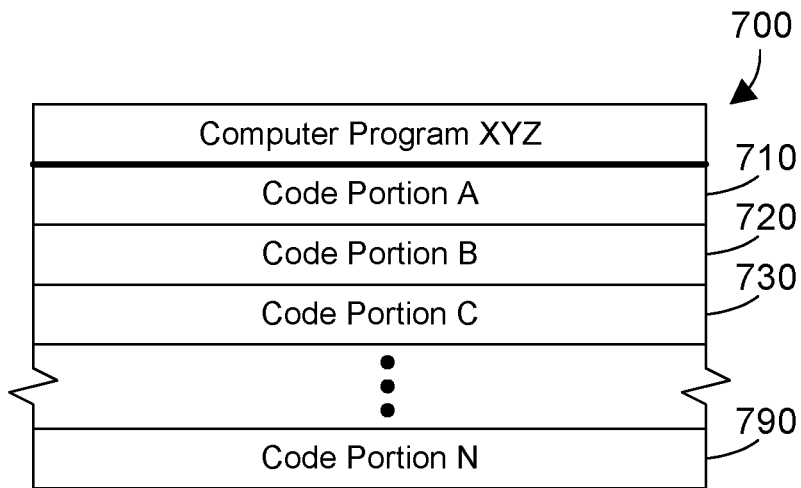
FIG. 7 is a block diagram showing a first sample computer program with different code portions.
Figure 8:
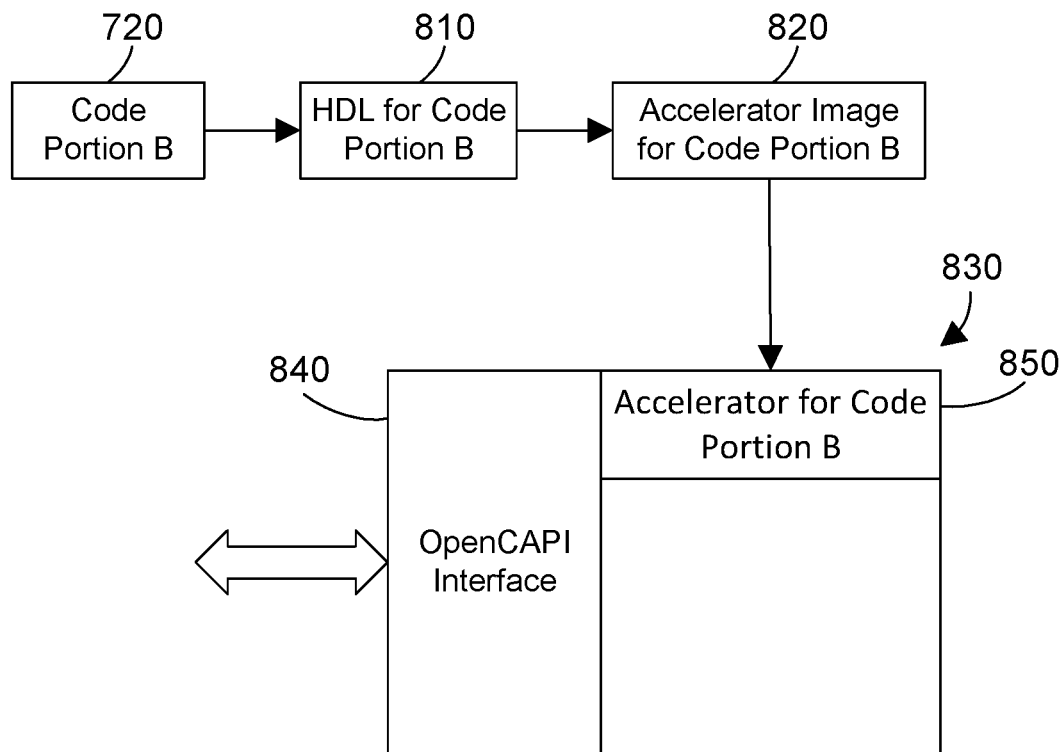
FIG. 8 is a block diagram showing how a code portion can be transformed to HDL, then to an accelerator image, which can be deployed to a programmable device to provide an accelerator.

Some examples are now provided to illustrate the concepts discussed above. FIG. 7 shows a sample computer program 700 that includes multiple code portions, shown in FIG. 7 as code portion A 710, code portion B 720, code portion C 730, . . . , code portion N 790. We assume code portion B 720 is identified as a code portion that will be improved from being implemented in a hardware accelerator. Code portion B 720 is then converted to a corresponding HDL representation 810, as shown in FIG. 8. The HDL for code portion B 810 is then used to generate an accelerator image for code portion B 820. This could be done, for example, using the method shown in FIG. 4, or using any other suitable method. Once the accelerator image for code portion B 820 has been generated, the accelerator image is loaded into a programmable device 830 to generate the accelerator for code portion B 850. Programmable device 830 is one suitable implementation for the programmable device 312 shown in FIG. 3, and preferably includes an OpenCAPI interface 840.

Figure 9:
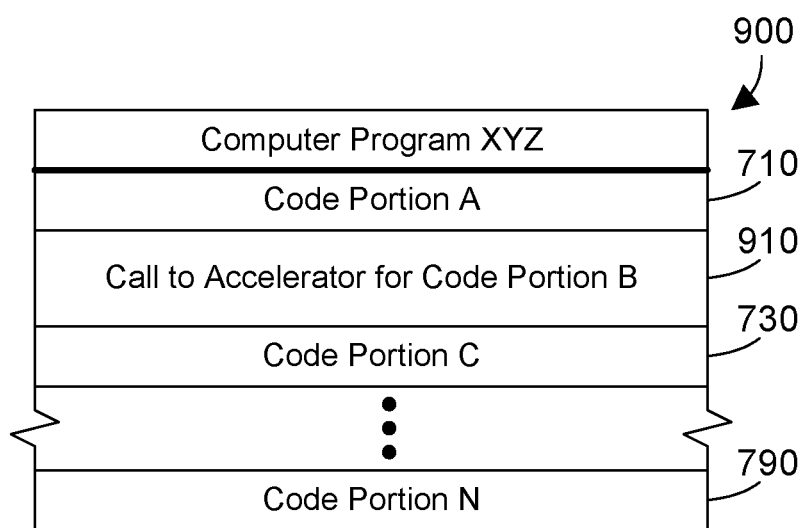
FIG. 9 is a block diagram showing the computer program in FIG. 7 after code portion B has been replaced with a call to the accelerator for code portion B.

Once the accelerator is deployed in the programmable device 830, the code portion B in the computer program is deleted and replaced by a call to the accelerator for code portion B 910 shown in FIG. 9. In the most preferred implementation, the accelerator for code portion B includes a return to the code that called it once the processing in the accelerator for code portion B is complete. In this manner the computer program 900, when it needs to execute what was previously code portion B, will make a call to the accelerator for code portion B, which will perform the needed functions in hardware, then return to the computer program. In this manner a suitable accelerator may be automatically generated for an identified code portion to increase the run-time performance of the computer program.

In a first implementation, an accelerator may be dynamically generated to improve the performance of a computer program, as shown in FIGS. 4-9 and described above. In a second implementation, once an accelerator is dynamically generated, it can be stored in a catalog so it may be reused when needed. FIG. 10 shows a sample accelerator catalog 1000, which is one suitable implementation for the accelerator catalog 329 shown in FIG. 3. An accelerator catalog may include any suitable data or information that may be needed for an accelerator or the corresponding code portion. For the specific example shown in FIG. 10, accelerator catalog includes each of the following fields: Name, Location, Least Recently Used (LRU), Most Recently Used (MRU), Dependencies, Capabilities, Latency, and Other Characteristics. The Name field preferably includes a name for the accelerator. The name field may also include a name for a code portion that corresponds to the accelerator. The location field preferably specifies a path that identifies the location for the accelerator image. While the accelerator image could be stored in the catalog 1000, in the most preferred implementation the catalog 1000 instead includes a path to storage external to the accelerator catalog 1000 where the accelerator image is stored. The least recently used (LRU) field could include the time when the accelerator was used the first time. In the alternative, the LRU field could include a flag that is set when the accelerator is the least recently used of all the accelerators in the catalog. The most recently used (MRU) field could include the time when the accelerator was last used. In the alternative, the MRU field could include a flag that is set when the accelerator is the most recently used of all the accelerators in the catalog. The error rate field provides a suitable error rate for the accelerator, and can be expressed in any suitable way. For the example in FIG. 10, the error rate is expressed as a number X of errors per 100 runs of the accelerator. The error rate field could include any suitable error information that could be, for example, dynamically monitored so an increase in the error rate could result in a notification to take corrective action. The dependencies field may indicate any dependencies the accelerator may have. For example, the dependencies field could specify the specific programmable device the accelerator was designed for. The dependencies field could also specify any dependencies on other accelerators. Thus, accelerator Acc1 in FIG. 10 has a dependency on Acc2, which means Acc1 needs Acc2 to also be implemented. The capabilities field can provide any suitable indication of the capabilities of the accelerator. In the two entries shown in FIG. 10, the capabilities are shown as floating point (FP) Unit for Acc1 and Graphics for AccN. Note, however, the capabilities can be indicated in any suitable way. For example, the capabilities could include a specification of the code portion for which the accelerator was implemented. A separate index could be maintained that correlates each code portion to its corresponding accelerator, along with a descriptor or other data that describes attributes of the code portion. The capabilities field could include any suitable information, such as a pointer to the index, so the code portion corresponding to the accelerator could be easily identified.

The latency field preferably specifies average latency for the accelerator. For the example shown in FIG. 10, Acc1 has a latency of 1.0 microseconds while accelerator AccN has a latency of 500 nanoseconds. Latency could represent, for example, the time required for the accelerator to perform its intended function. The other characteristics field can include any other suitable information or data that describes or otherwise identifies the accelerator, its characteristics and attributes, and the code portion corresponding to the accelerator. For the two sample entries in FIG. 10, the other characteristics field indicates Acc1 includes a network connection, and AccN has an affinity to Acc5, which means AccN should be placed in close proximity to Acc5 on the programmable device, if possible. The various fields in FIG. 10 are shown by way of example, and it is within the scope of the disclosure and claims herein to provide an accelerator catalog with any suitable information or data.

Figure 11:
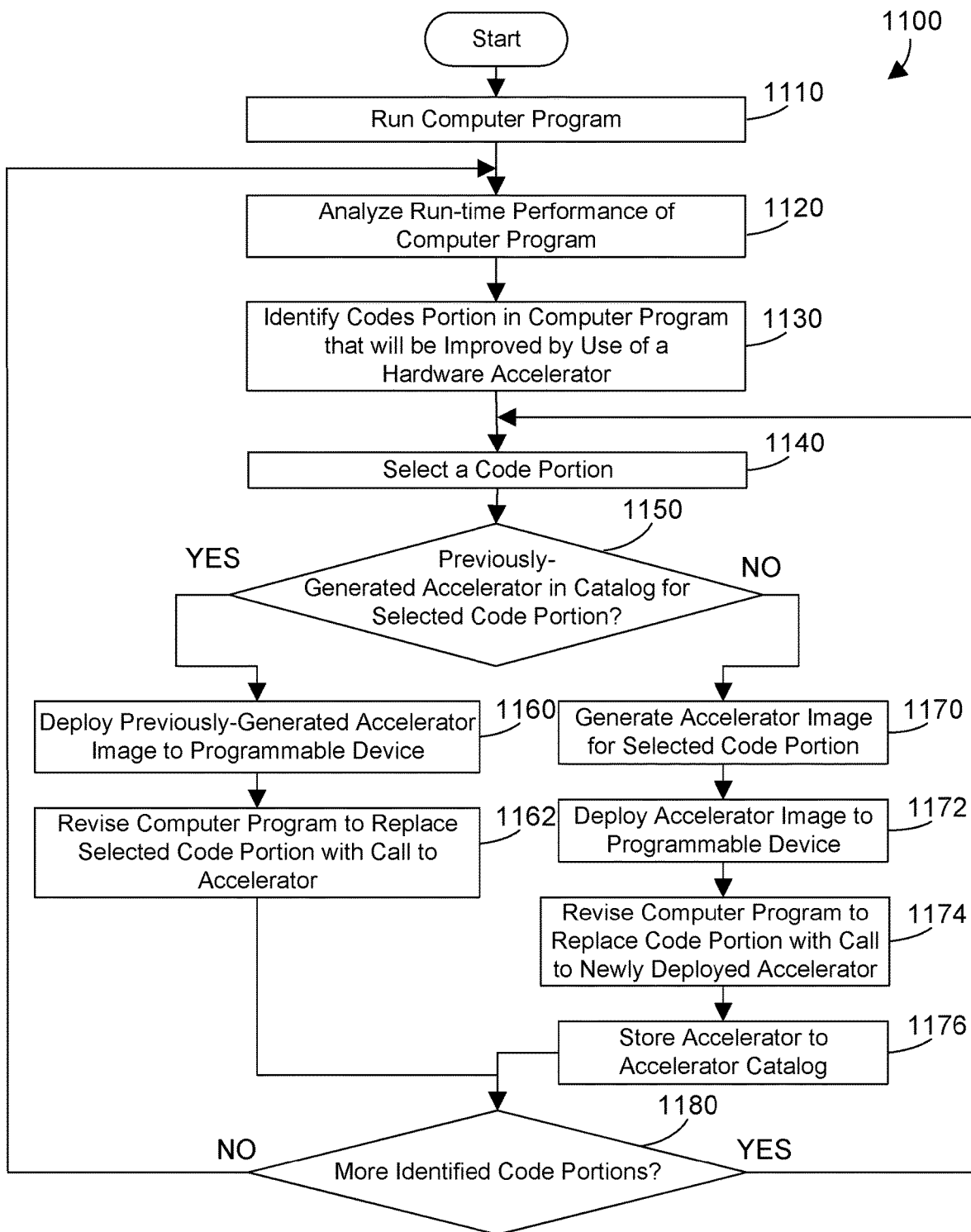
FIG. 11 is a flow diagram of a method for deploying an accelerator for a code portion when a catalog of previously-generated accelerators is maintained.

Referring to FIG. 11, a method 1100 in accordance with the second implementation begins by running the computer program (step 1110). The run-time performance of the computer program is analyzed (step 1120). One or more code portions in the computer program that will be improved by use of a hardware accelerator are identified (step 1130). One of the identified code portions is selected (step 1140). When there is a previously-generated accelerator in the accelerator catalog for the selected code portion (step 1150=YES), the previously-generated accelerator image is deployed to the programmable device (step 1160) to provide the accelerator. The computer program is then revised to replace the selected code portion with a call to the accelerator (step 1162). When there is no previously-generated accelerator in the catalog for the selected code portion (step 1150=NO), an accelerator image for the selected code portion is dynamically generated (step 1170), the accelerator image is deployed to a programmable device (step 1172), the computer program is revised to replace the code portion with a call to the newly deployed accelerator (step 1174), and the accelerator is stored to the accelerator catalog (step 1176). When the accelerator image is stored within the catalog entry, step 1176 write the accelerator image to the catalog. When the accelerator image is stored in storage external to the catalog, step 1176 stores the accelerator image to the external storage and writes an entry to the accelerator catalog that includes a path to the accelerator image in the external storage.

When there are more identified code portions (step 1180=YES), method 1100 loops back to step 1140 and continues. When there are no more identified code portions (step 1180=NO), method 1100 loops back to step 1120 and continues. This means method 1100 most preferably continuously monitors the computer program and dynamically generates and/or deploys accelerators as needed to improve the run-time performance of the computer program.

Figure 15:
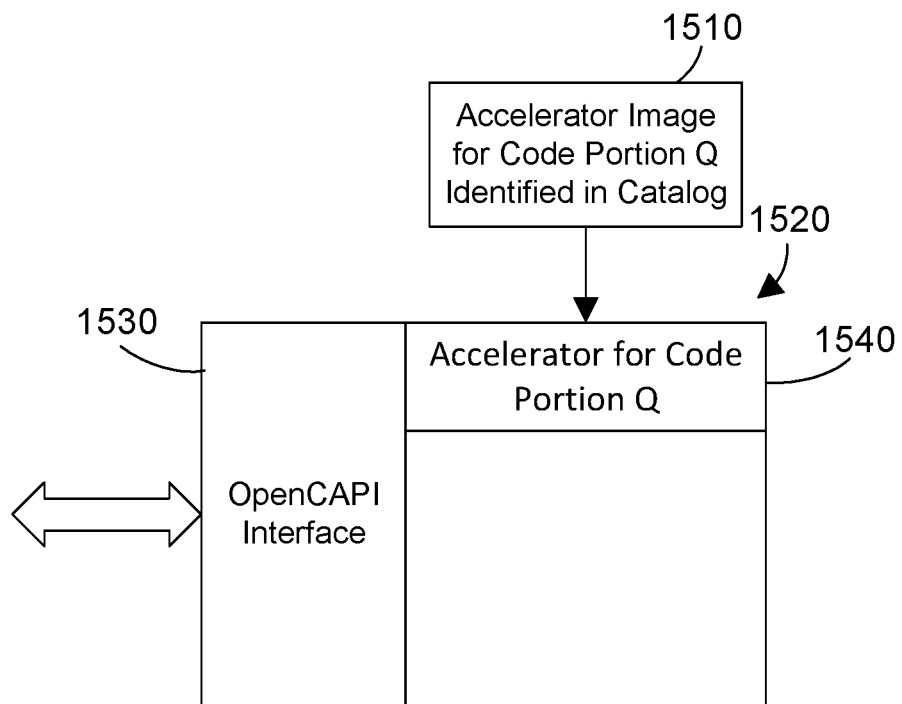
FIG. 15 is a block diagram showing the deployment of an accelerator image for code portion Q identified in the catalog in FIG. 14 to a programmable device.

An example is now provided to illustrate the concepts in FIG. 11 that relate to the second preferred implementation. FIG. 12 shows a sample computer program 1200 that includes many code portions, represented in FIG. 12 as code portion P 1210, code portion Q 1220, code portion R 1230, . . . , code portion Z 1290. We assume steps 1110, 1120 and 1130 in FIG. 11 are performed. In step 1130, we assume code portion Q 1220 and code portion R 1230 are identified as code portions that will be improved by implementing these code portions in an accelerator, as shown in table 1300 in FIG. 13. We further assume we have an accelerator catalog 1400 that is one suitable implementation for the accelerator catalog 329 shown in FIG. 3. Accelerator catalog 1400 has a single entry for AccQ, which we assume is an accelerator for code portion Q 1220 that was generated previously. Because the accelerator for code portion Q was previously-generated, the corresponding accelerator image can be used without having to generate the accelerator image anew. We assume code portion Q 1220 is selected in step 1140. There is a previously-generated accelerator in the catalog for code portion Q (step 1150=YES), so the previously-generated accelerator image corresponding to code portion Q 1510 is deployed to the programmable device (step 1160), as shown in FIG. 15. Deploying the accelerator image for code portion Q 1510 identified in the catalog to the programmable device 1520 results in implementing the accelerator for code portion Q 1540 in the programmable device 1520. The accelerator for code portion Q 1540 may then be called by the computer program to perform the functions of previous code portion Q in hardware, thereby increasing the run-time performance of the computer program. The programmable device 1520 is one suitable example of a programmable device 312 shown in FIG. 3, and preferably includes an OpenCAPI interface 1530.

Figure 16:
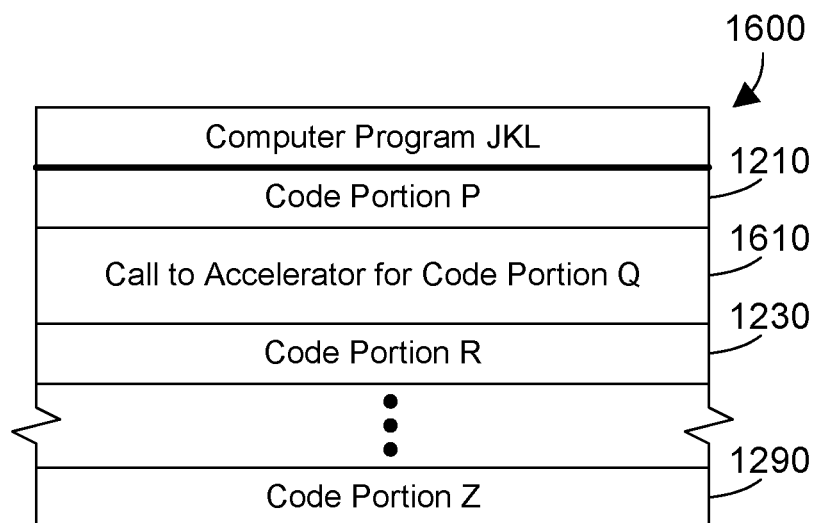
FIG. 16 is a block diagram showing the computer program in FIG. 12 after code portion Q has been replaced with a call to the accelerator for code portion Q.

The computer program is then revised to replace the selected code portion Q 1220 with a call to the accelerator for code portion Q (step 1162). FIG. 16 shows the computer program 1200 in FIG. 12 after the code portion Q has been replaced with the call to the accelerator for code portion Q, as shown at 1610 in FIG. 16. Thus, computer program 1600, instead of executing code portion Q, instead invokes the accelerator for code portion Q 1540 in the programmable device 1520 to increase the run-time performance of the computer program.

Figure 17:
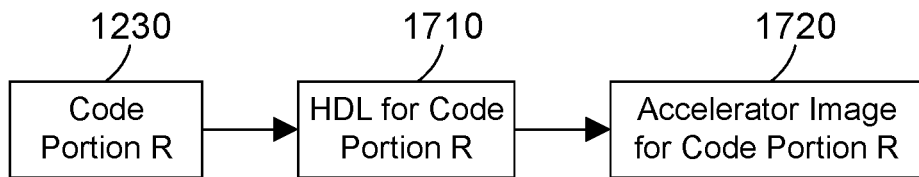
FIG. 17 is a block diagram showing generation of an accelerator image from code portion R in the computer program shown in FIGS. 12 and 16.
Figure 18:
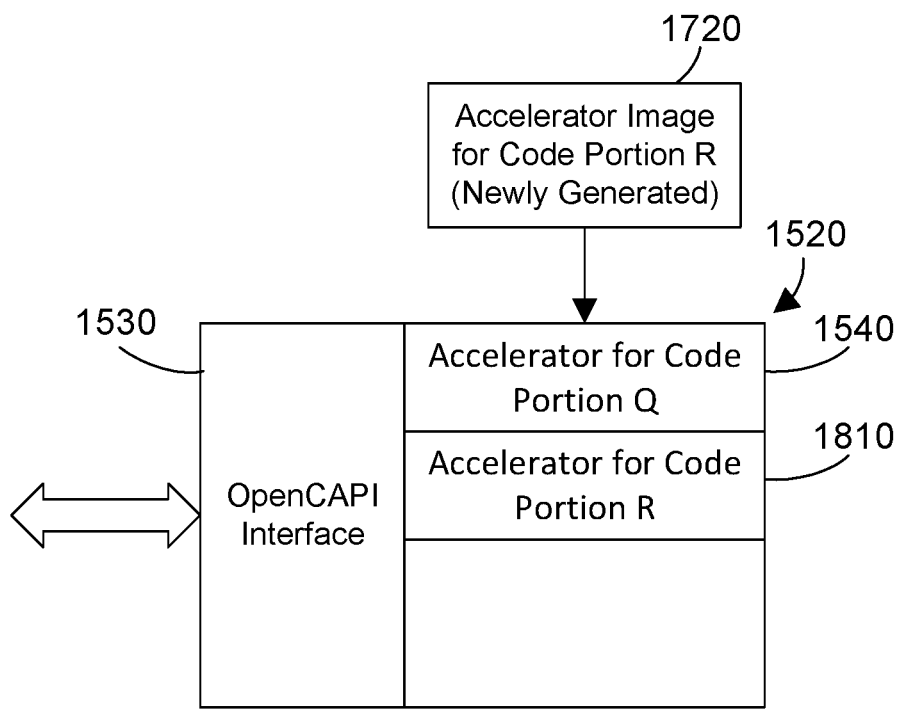
FIG. 18 is a block diagram showing the deployment of a newly-generated accelerator image for code portion R to a programmable device.
Figures 19, 20:
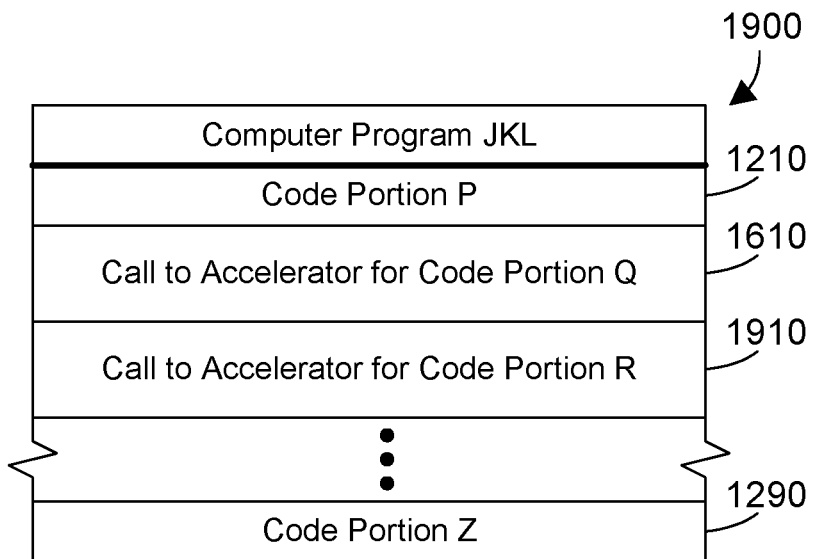
FIG. 19 is a is a block diagram showing the computer program in FIG. 16 after code portion R has been replaced with a call to the accelerator for code portion R.
FIG. 20 is a block diagram of the accelerator catalog 1400 shown in FIG. 14 after an entry is created representing the accelerator for code portion R.

There is still an identified code portion (step 1180=YES), namely code portion R shown in FIG. 13, so method 11 in FIG. 11 loops back to step 1140, where code portion R 1230 is selected (step 1140). There is no previously-generated accelerator in the catalog 1400 shown in FIG. 14 for code portion R (step 1150=NO), so an accelerator image is dynamically generated for code portion R (step 1170). This is represented in FIG. 17, where the code portion R 1230 is used to generate HDL for code portion R 1710, which is used to generate the accelerator image for code portion R 1720. The accelerator image for code portion R 1720, which was newly dynamically generated, is then deployed to the programmable device (step 1172). This is shown in FIG. 18, where the programmable device 1520 that already includes accelerator for code portion Q 1540 is loaded with the accelerator image for code portion R 1720 to generate the accelerator for code portion R 1810. The computer program is then revised to replace code portion R with the call to the accelerator for code portion R (step 1174), as shown at 1910 in FIG. 19. The accelerator for code portion R is also stored in the accelerator catalog (step 1176), resulting in the accelerator catalog 1400 containing entries AccQ and AccR corresponding to two accelerators, as shown in FIG. 20.

Figure 21:
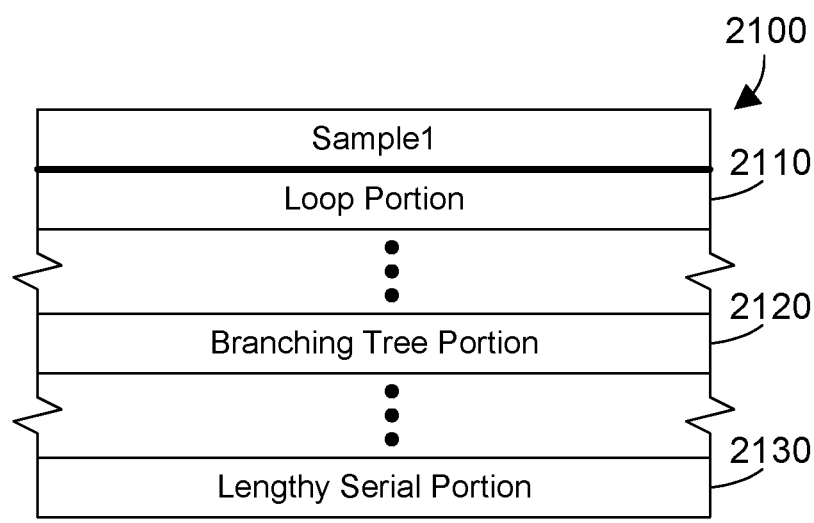
FIG. 21 is a block diagram of a sample computer program.
Figure 22:
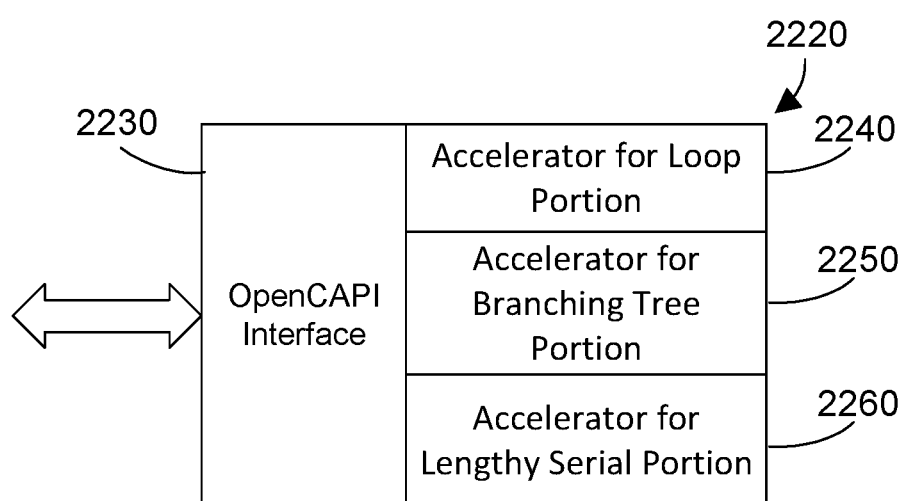
FIG. 22 is a block diagram of a programmable device that has an OpenCAPI interface and includes an accelerator for the loop portion in FIG. 21, an accelerator for branching tree portion in FIG. 21, and an accelerator for lengthy serial portion in FIG. 21.

A more specific example is shown in FIGS. 21 and 22. For this example we assume a computer program called Sample1 2100 includes three different code portions of interest, namely a loop portion 2110, a branching tree portion 2120, and a lengthy serial portion 2130. Loop portion 2110 is representative of a code portion that is a loop that can be unrolled because each iteration is largely independent from other iterations. Due to the independence of each iteration, the loop can be unrolled, and the loop function can be deployed to an accelerator so each iteration will run in parallel in hardware. Financial risk calculations sometimes include code portions such as loop portion 2110. Running different iterations of the loop in parallel in a hardware accelerator increases the run-time performance of the Sample1 computer program.

Computer program Sample1 2100 also includes a branching tree portion 2120. We assume for this example branching tree portion 2120 operates on one or more relatively deep branching trees. In this case, the branching tree portion 2120 can be deployed to an accelerator so each branch of the branching tree will run in parallel in hardware, the branch selection criteria will be calculated, and at the final stage of the logic, the result will be selected from the selected branch. Running different branches of the branching tree in parallel in a hardware accelerator increases the run-time performance of the Sample1 computer program.

Computer program Sample1 2100 also includes a lengthy serial portion 2130. We assume for this example the lengthy serial portion 2130 can be shortened by leveraging unique hardware capabilities in an accelerator. Some math functions, for example, could by lengthy serial portions that could be implemented in an accelerator. Running a lengthy serial portion in hardware increases the run-time performance of the Sample1 computer program.

We assume the code portions in FIG. 21 are identified according to profile data 520 generated by the code profiler 510 in FIG. 5. The criteria used by the code selection tool 530 to select the code portions 2110, 2120 and 2130, which are examples of code portion 326 in FIGS. 4 and 5, may be any suitable criteria. The three example code portions 2110, 2120 and 2130 in FIG. 21 as described above indicate suitable criteria that could be used by the code selection tool 530 to select code portions 2110, 2120 and 2130 to be implemented in one or more accelerators. Of course, the claims and disclosure herein expressly extend to any suitable criteria for the code selection tool 530 to select one or more code portions to be implemented in one or more accelerators.

FIG. 22 shows a programmable device 2220 that has an OpenCAPI interface 2230 and includes an accelerator for loop portion 2240, an accelerator for branching tree portion 2250, and an accelerator for lengthy serial portion 2260. While these three accelerators are shown to be implemented in the same programmable device 2220 in FIG. 22, one skilled in the art will recognize these could be implemented in separate programmable devices as well.

Figure 23:
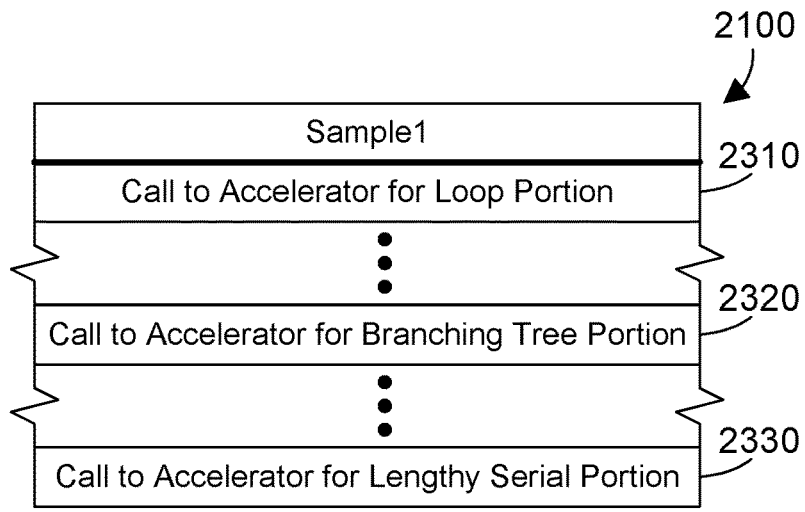
FIG. 23 is a block diagram of the computer program in FIG. 21 after the code portions have been replaced with calls to corresponding accelerators.

FIG. 23 shows the computer program Sample1 2100 after the code portions shown in FIG. 21 are replaced with calls to the hardware accelerators shown in FIG. 22. Thus, loop portion 2110 in FIG. 21 has been replaced by a call to the accelerator for loop portion 2310; the branching tree portion 2320 in FIG. 21 has been replaced by a call to the accelerator for the branching tree portion 2320; and the lengthy serial portion 2130 in FIG. 21 has been replaced by a call to the accelerator for the lengthy serial portion 2330. Because the Sample1 computer program 2100 in FIG. 23 now includes calls to hardware accelerators, the run-time performance of the computer program 2100 is increased.

Figure 24:
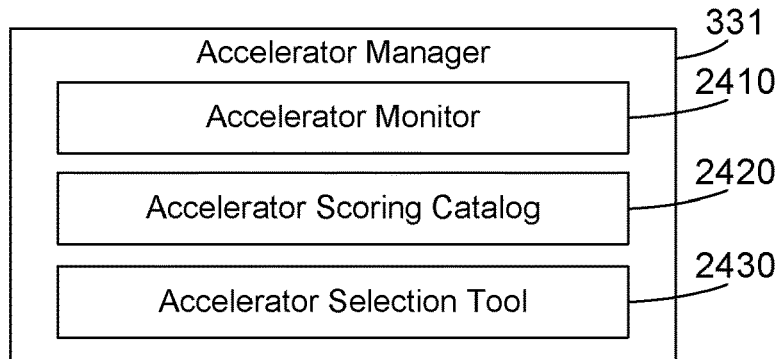
FIG. 24 is a block diagram of one suitable implementation for the accelerator manager shown in FIG. 3.

Referring to FIG. 24, one suitable implementation for the accelerator manager 331 shown in FIG. 3 includes an accelerator monitor 2410, an accelerator scoring catalog 2420, and an accelerator selection tool 2430. The accelerator monitor 2410 monitors characteristics of accelerators and logs those characteristics in the accelerator scoring catalog 2420. Accelerator scoring catalog 2420 includes multiple accelerators and metrics that characterize the accelerators in some suitable way, examples of which are described in more detail below with reference to FIG. 27. Accelerator scoring catalog 2420 is one suitable example for the accelerator catalog 329 shown in FIG. 3. When an accelerator is needed, the accelerator selection tool 2430 receives accelerator selection criteria corresponding to the needed accelerator, compares the accelerator selection criteria to the metrics in the accelerator scoring catalog 2420, then selects one of the accelerators in the accelerator scoring catalog. The accelerator manager 331 can then call the selected accelerator.

Figure 25:
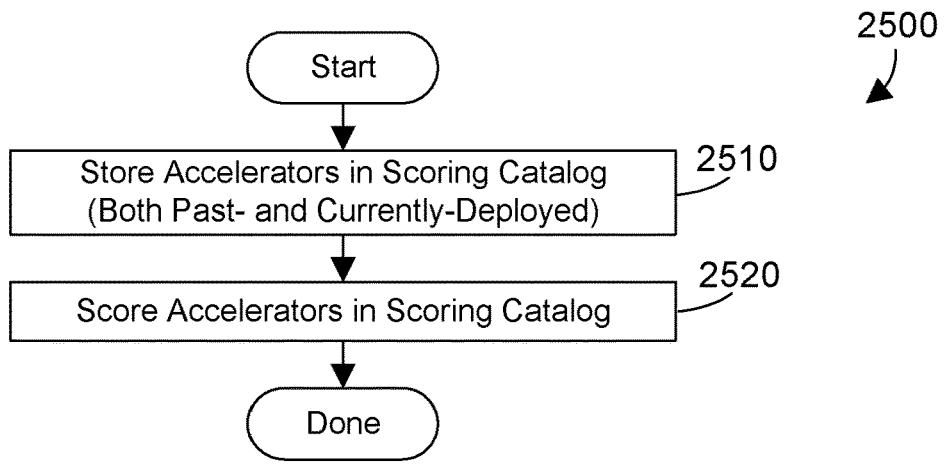
FIG. 25 is a flow diagram of a method for scoring accelerators.

Referring to FIG. 25, method 2500 is preferably performed by the accelerator manager 331 shown in FIGS. 3 and 24. Entries corresponding to accelerators are stored in the accelerator scoring catalog, both for accelerators that were deployed in the past as well as for accelerators that are currently deployed to a programmable device (step 2510). The accelerators in the accelerator scoring catalog are then scored (step 2520). In one specific implementation, an entry is created in the accelerator scoring catalog when an accelerator is initially defined, such as when a code portion 326 is input to an accelerator image generator 327 shown in FIG. 4, which then produces the corresponding accelerator image 480. Once the entry for the accelerator is initially created in the accelerator scoring catalog, the metrics corresponding to the accelerator may be written or updated as these metrics change over time. The metrics in the accelerator scoring catalog represent a "score" for the accelerators in the catalog. Thus, scoring of accelerators in the scoring catalog in step 2520 preferably comprises writing one or more values to the defined metrics for an accelerator in the accelerator scoring catalog based on monitored attributes of the accelerator.

Figure 26:
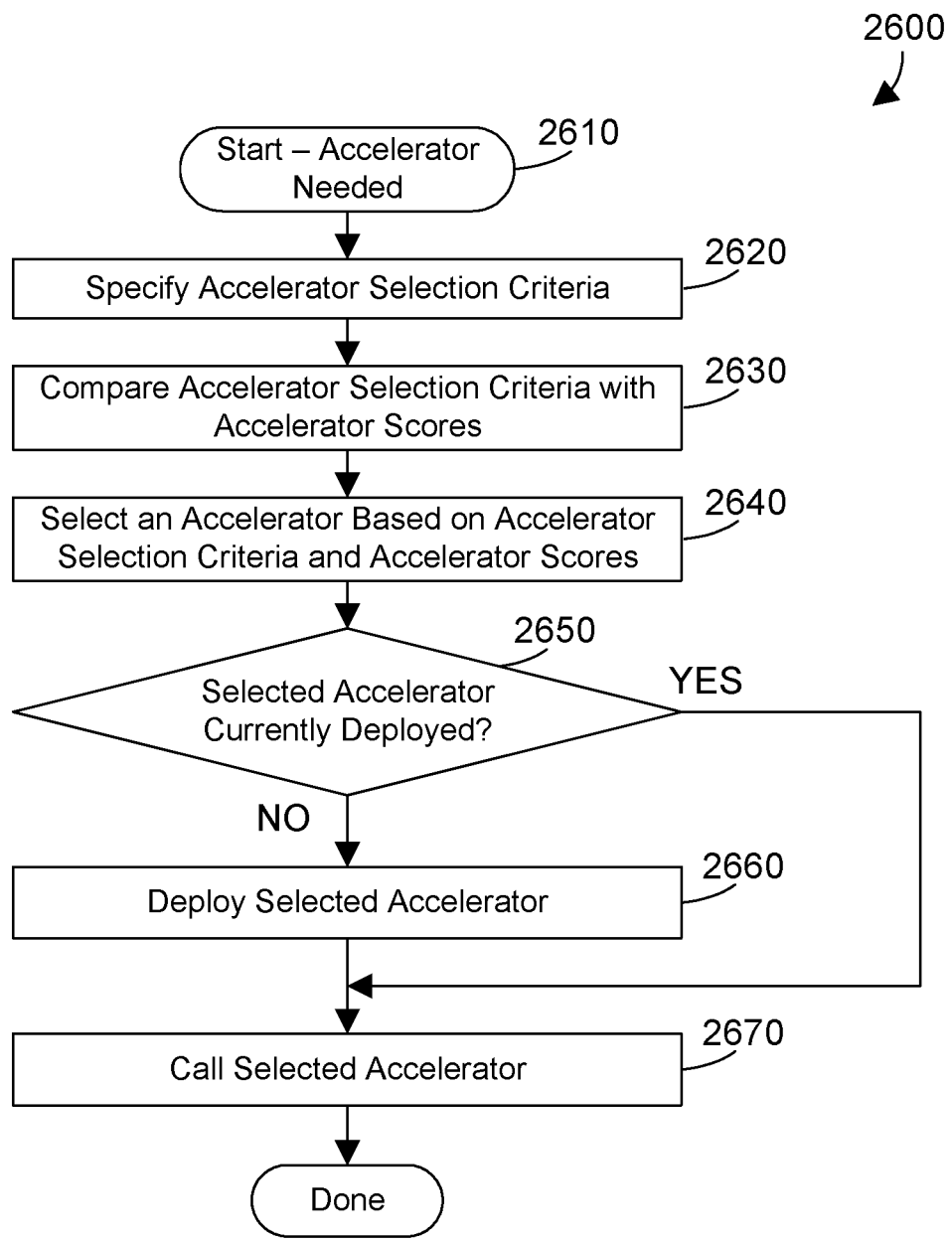
FIG. 26 is a flow diagram of a method for selecting and calling an accelerator using specified accelerator selection criteria.

Referring to FIG. 26, method 2600 is preferably performed by the accelerator manager 331 shown in FIGS. 3 and 24. Method 2600 begins when an accelerator is needed (step 2610), which could mean, for example, that an accelerator needs to be called. Accelerator selection criteria is specified (step 2620). In one suitable implementation, a human user specifies the accelerator selection criteria in step 2620. In an alternative implementation, a computer program that needs the accelerator specifies the accelerator selection criteria in step 2620. The accelerator selection criteria can be any suitable criteria or expression that can be compared with the metrics (scores) stored in the accelerator scoring catalog to select one of the accelerators in the accelerator scoring catalog. Specific examples are shown in FIGS. 29-33 for the purpose of illustration. The accelerator selection criteria are compared with the accelerator scores in the accelerator scoring table (step 2630) to determine which accelerator or accelerators in the accelerator scoring table, if any, satisfy the accelerator selection criteria. Assuming one or more of the accelerators in the accelerator scoring table satisfies the accelerator selection criteria, an accelerator in the accelerator scoring table is selected (step 2640). When the selected accelerator is currently deployed (step 2650=YES), the selected accelerator in the programmable device to which the accelerator is currently deployed is called (step 2670). When the selected accelerator is not currently deployed (step 2650=NO), the selected accelerator is deployed to a programmable device (step 2660), and then called (step 2670). Method 2600 is then done.

Figure 27:
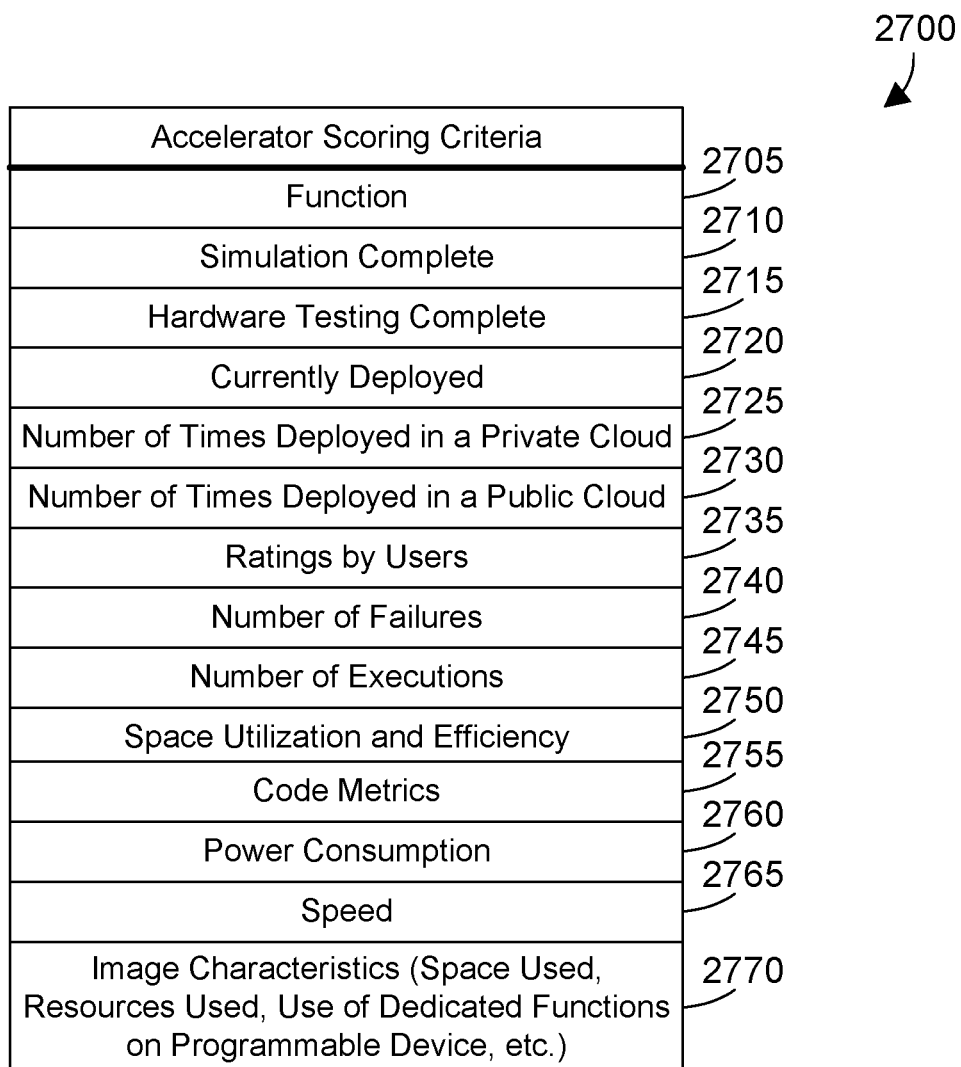
FIG. 27 is a table showing suitable examples for accelerator scoring criteria that could be used to score or characterize hardware accelerators.

The accelerator scoring criteria comprises any suitable metric that can be monitored and stored in the accelerator scoring catalog. Examples of suitable metrics for the accelerator scoring criteria are shown in FIG. 27 for the purpose of illustration. The metrics shown in FIG. 27 are not intended to be exhaustive or limiting. Accelerator scoring criteria 2700 may include a description of the function performed by the accelerator 2705. This description of function 2705 can be very high-level and broad, or can be very detailed and specific. Examples of functions 2705 that could be performed by accelerators include mathematical functions, database searches, etc. Accelerator scoring criteria 2700 may include whether the software simulation for the accelerator is complete 2710. In one suitable example, software simulation for the accelerator is complete in step 2710 when the simulation block 450 in FIG. 4 has completed software simulation for the accelerator. Simulation complete 2710 may be a binary flag that is set to one state to indicate that software simulation is not complete and is set to the opposite state to indicate that software simulation is complete. In the alternative, simulation complete 2710 may be a numerical value representing, for example, the percentage complete for the software simulation. Accelerator scoring criteria 2700 may also include whether hardware testing is complete 2715. In one suitable example, hardware testing for the accelerator is completed in step 2715 when the synthesis block 430 in FIG. 4 has complete synthesizing and testing the image for the accelerator. Hardware testing complete 2715 may be a binary flag that is set to one state to indicate that hardware testing is not complete and is set to the opposite state to indicate that hardware testing is complete. In the alternative, hardware testing complete 2715 may be a numerical value representing, for example, the percentage complete for the hardware testing.

Accelerator scoring criteria 2700 may also include an indication of whether the accelerator is currently deployed 2720. In one specific example, an accelerator is currently deployed when the accelerator image corresponding to the accelerator currently resides in a programmable device and the resulting accelerator is ready to be called. An accelerator is not currently deployed when the accelerator image does not currently reside in a programmable device or resides in a programmable device but is not ready to be called. Accelerator scoring criteria 2700 may also include a number of times the accelerator has been deployed in a private cloud 2725 and a number of times the accelerator has been deployed in a public cloud 2730. Accelerator scoring criteria 2700 may also include ratings by users 2735. For example, a feedback system may be implemented that allows users to rate accelerators on a scale of one to five, and the ratings by users 2735 could reflect those ratings, either in the aggregate or a mathematical representation, such as a mean or median.

Accelerator scoring criteria 2700 may also include a number of failures 2740 and a number of executions 2745 for the accelerator. Accelerator scoring criteria 2700 may additionally include space utilization and efficiency 2745, which can broadly represent any suitable metric that describes the space on the programmable device used by the accelerator or the efficiency of using resources on the programmable device by the accelerator. Accelerator scoring criteria 2700 may also include code metrics 2755, which can include any suitable metric relating to computer programs that called the accelerator. Accelerator scoring criteria 2700 may also include power consumption 2760 and speed 2765 for the accelerator. Accelerator scoring criteria 2700 may additionally include image characteristics 2770. Examples of suitable image characteristics 2770 include space used by the image on the programmable device, resources used by the image on the programmable device, dedicated functions used by the image on the programmable device, etc.

The specific metrics or accelerator scoring criteria shown in FIG. 27 are shown by way of example. The disclosure and claims herein expressly extend to any suitable metric that could be used to characterize, quantify or otherwise describe an accelerator.

Some specific examples are provided in FIGS. 28-33 to illustrate some of the concepts discussed above. The accelerator scoring catalog 2800 includes nine entries, one for each of nine different accelerators named Acc1 through Acc9 as shown on the left side of FIG. 28. The fourteen columns to the right of the Name column in the accelerator scoring catalog 2800 in FIG. 28 correspond, in order, to the accelerator scoring criteria 2705 through 2770 shown in FIG. 27. We use for this example some symbolic values in the accelerator scoring catalog 2800 for the sake of simplicity. Thus, the functions in the F column are listed as F1, F2, F3 and F4 without describing which specific functions correspond to these labels. We assume the simulation complete SC and hardware testing complete HTC columns include binary values, shown as Y for yes and N for no, that indicated whether simulation is complete and whether hardware testing is complete. The Dep column is a binary value indicating whether the accelerator is currently deployed to a programmable device and ready to be called. The # Priv column includes a numerical value that indicates the number of times the accelerator has been deployed to a private cloud. The # Pub column includes a numerical value that indicates the number of times the accelerator has been deployed to a public cloud. The Rtgs column indicates an average rating for this accelerator by users on a scale of one to five. The Fails column includes a numerical value that specifies how many times the accelerator has failed. A failure of an accelerator can be defined in any suitable way, such as failure to accomplish its function within a defined time period, providing an error signal, failure to complete processing, etc. The Exec column includes a numerical value that specifies the number of executions of the accelerator. Note an accelerator can be executed many times for each deployment, which will mean the number of executions in the Exec column will always be greater than the sum of deployments in the # Priv and # Pub columns. The Eff column includes a numerical value that specific efficiency for the accelerator. Efficiency can be defined and measured in any suitable way. The Code column, when populated, includes some attributed of the code that called the accelerator. Thus, Attr1 shown for Acc4 in the Code column in FIG. 28 represents some attribute of code, whether it be a single computer program or multiple computer programs, that called Acc4. The Pwr column includes a value that indicates power consumption of the accelerator. For the ease of illustration, we assume four different power level ranges P1, P2, P3 and P4 are defined for the accelerators, and each accelerator will have a power consumption that lies within one of these defined ranges. The Speed column includes a value that indicates speed of the accelerator. Again, for the ease of illustration, we assume four different speed ranges 51, S2, S3 and S4 are defined for the accelerators, and each accelerator will have a speed that lies within one of these defined ranges. The Img column includes any suitable value or data that characterizes the image corresponding to the accelerator, such as the space used by the image on the programmable device, the resources used by the image on the programmable device, the use of dedicated functions by the image on the programmable device, etc. Many of the metrics in the accelerator scoring catalog 2800 in FIG. 28 have been populated so the selection of an accelerator based on these metrics may be illustrated. It is understood the population of the values in the metrics in the accelerator scoring catalog 2800 is preferably performed by the accelerator manager 331 monitoring various attributes of accelerators and writing those metrics to the accelerator scoring catalog 2800.

Referring to FIG. 29, we assume accelerator selection criteria is defined that specifies F=1, SC=YES, HTC=YES, Dep=YES, # Priv >3, Fails <10%, and Executions>10. We see from the logged metrics in the accelerator scoring catalog that accelerators Acc1, Acc3 and Acc9 have function F1. All three of these have SC=YES. Acc1 has HTC=NO, so Acc1 does not satisfy the HTC=YES selection criteria. This leaves Acc3 and Acc9 as possible candidates. Both Acc3 and Acc9 have Dep=YES. Note, however, that Acc3 has been deployed to a private cloud four times, while Acc9 has been deployed to a private cloud only once. This means Acc3 satisfies the # Priv >3 selection criteria, but Acc9 does not. This narrows the selection down to Acc3. We now check the remaining selection criteria to see if Acc3 satisfies these. The number of failures for Acc3 is 1 out of 17 executions. One out of seventeen is less than 10%, so Acc3 satisfies the Fails <10% selection criteria. The number of executions for Acc3 is 17, which satisfies the Execution >10 selection criteria. The result is Acc3 is the only accelerator in the accelerator scoring catalog 2800 in FIG. 8 that satisfies all the specified accelerator selection criteria, so the result set for the accelerator selection criteria shown in FIG. 29 only has Acc3. The accelerator manager then calls Acc3.

Note the example accelerator selection criteria shown in FIG. 29 includes mathematical relationships, and can include relationships between metrics in the accelerator scoring catalog. For example, the criteria Fails <10% requires dividing the number of failures in the Fails column by the number of executions in the Exec column to determine whether the number of failures is less than 10% of the number of executions. This simple example shows the accelerator selection criteria can specify specific values for metrics, can specify ranges of values for metrics, and can specify any suitable mathematical, logical or other relationship between multiple metrics.

A second example is given in FIG. 30. The accelerator selection criteria defined in FIG. 30 specifies F=4, Dep=YES, # Total (Priv+Pub) >10, Executions>100. We see that Acc5 and Acc7 both satisfy the F=4 selection criteria. But neither Acc5 or Acc7 are currently deployed, as indicated by the N values in the Dep column for both these accelerators. The result set it thus empty, and does not include any accelerators because none of the accelerators in the accelerator scoring catalog satisfies all of the accelerator selection criteria in FIG. 30. Note the accelerator selection criteria in FIG. 30 illustrates once again that the selection criteria can specify a suitable relationship between metrics, as shown by the # Total (Priv+Pub) >10 parameter in the selection criteria, which will sum the # Priv and # Pub values to determine whether the total number of deployments to private and public clouds is greater than 10.

A third example is given in FIG. 31. The accelerator selection criteria defined in FIG. 31 specifies F=3, Dep=YES, # Priv >1, # Pub >1, Fails <10%, Executions>100. We see that Acc4 and Acc8 both satisfy the F=4 selection criteria. Both Acc4 and Acc8 are currently deployed, so both satisfy the Dep=YES selection criteria. Both Acc4 and Acc8 have been deployed more than once to a private cloud, as indicated by the value of 3 for # Priv for Acc4 and the value of 5 for # Priv for Acc8, so both Acc4 and Acc8 satisfy the # Priv >1 selection criteria. Similarly, both Acc4 and Acc8 have been deployed more than once to a public cloud, as indicated by the value of 2 for # Pub for Acc4 and the value of 3 for # Pub for Acc8, so both Acc4 and Acc8 satisfy the # Pub >1 selection criteria. The next selection criteria is Fails <10%. Acc4 had no failures in 1540 executions, so Acc4 satisfies this selection criteria. Acc8 had 26 failures in 147 executions, which is greater than 10%, so Acc8 does not satisfy the Fails <10% selection criteria. Acc4 had 1543 executions, which is greater than 100, thereby satisfying the Executions >100 selection criteria. The result set for the accelerator selection criteria in FIG. 31 when applied to the sample accelerator scoring catalog 2800 in FIG. 28 includes Acc4, as shown in FIG. 31. The accelerator manager then calls Acc4.

A fourth example is given in FIG. 32. The accelerator selection criteria defined in FIG. 32 specifies F=2, # Pub >1, Fails=0, Executions>100, Pwr<P3. We see from FIG. 28 that Acc2 and Acc6 satisfy the F=2 selection criteria. Acc2 has not been deployed to a public cloud, as indicated by the value of zero in the # Pub column for Acc2. As a result, Acc2 does not satisfy the # Pub >1 selection criteria. Acc6 has been deployed to a public cloud twice, which satisfies the # Pub >1 selection criteria. Acc6 has no failures, which satisfies the Fails=0 selection criteria. Acc6 has been executed 341 times, which satisfies the Executions >100 selection criteria. Acc6 has a power rating of P1, which was assume for this example is less than the power rating of P3, so Acc6 satisfies the Pwr<P3 selection criteria. The result set for the accelerator selection criteria in FIG. 32 when applied to the sample accelerator scoring catalog 2800 in FIG. 28 includes Acc6, as shown in FIG. 32. The accelerator manager then calls Acc6.

A fifth example is given in FIG. 33. The accelerator selection criteria defined in FIG. 33 specifies F=1, # Priv >1, Fails <10%, Executions>10, Speed=51 or S2. We see from FIG. 28 that accelerators Acc1, Acc3 and Acc9 satisfy the F=1 selection criteria. Acc1 does not satisfy the # Priv >1 selection criteria, but Acc3 and Acc9 do. Both Acc3 and Acc9 satisfy the remaining selection criteria, namely: # Priv >1, Fails <10%, Executions>10, Speed=51 or S2. The result set for the accelerator selection criteria in FIG. 33 when applied to the sample accelerator scoring catalog 2800 in FIG. 28 includes Acc3 and Acc9, as shown in FIG. 33. Because the result set includes multiple accelerators, the accelerator manager preferably selects one of the accelerators according to any suitable criteria or heuristic, then calls the selected accelerator.

Hardware accelerators currently deployed to programmable devices or previously deployed to programmable devices are scored according to various metrics and attributes that characterize the accelerators. Examples of suitable accelerator scoring criteria include whether the software simulation of the accelerator is complete, whether hardware testing is complete, whether the accelerator is currently deployed, the number of times the accelerator has been deployed to a private cloud, the number of times the accelerator has been deployed to a public cloud, ratings by users, number of failures, number of executions, space utilization and efficiency, code metrics, power consumption, speed, and image characteristics, including space used, resources used, use of dedicated functions on a programmable device, etc. These accelerator scoring criteria are tracked for each accelerator in an accelerator scoring catalog. When an accelerator is needed, accelerator selection criteria is specified and compared with the accelerator scoring criteria in the accelerator scoring catalog to locate one or more accelerators that satisfy the accelerator selection criteria.

The accelerators shown in FIGS. 8, 15, 18 and 22 include an OpenCAPI interface. Note, however, the OpenCAPI interface is not strictly necessary to dynamically generate, deploy and manage accelerators as disclosed and claimed herein. Deploying an accelerator to a programmable device that includes an OpenCAPI interface is useful because the OpenCAPI specification is open, allowing anyone to develop to the specification and interoperate in a cloud environment. In addition, the OpenCAPI interface provides lower latency, reducing the "distance" between an accelerator and the data it may consume or produce. Furthermore, OpenCAPI provides higher bandwidth, increasing the amount of data an accelerator can consume or produce in a given time. These advantages of OpenCAPI combine to provide a good environment for implementing a code portion of a computer program in an accelerator, and to lower the threshold for a code portion to be better in an accelerator than in the computer program. However, the disclosure and claims herein apply equally to accelerators that do not include or have access to an OpenCAPI interface.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

What is claimed is:

1. An apparatus comprising:
    at least one processor;
    a memory coupled to the at least one processor;
    a plurality of programmable devices coupled to the at least one processor, wherein each of the plurality of programmable devices comprises a field-programmable gate array (FPGA) that implements an Open Coherent Accelerator Processor Interface (OpenCAPI);
    an accelerator scoring catalog residing in the memory that includes a plurality of names of a plurality of accelerators for the plurality of programmable devices and a plurality of metrics for each of the plurality of accelerators, wherein the plurality of accelerators comprises all accelerators deployed in the past and currently deployed to the plurality of programmable devices, wherein the plurality of metrics for a selected accelerator in the plurality of accelerators comprises:

a number of times the selected accelerator has been deployed in a private cloud;

a number of times the selected accelerator has been deployed in a public cloud;

a number of failures of the selected accelerator; and a number of executions of the selected accelerator;

an accelerator manager residing in the memory and executed by the at least one processor, the accelerator manager monitoring accelerators deployed to the plurality of programmable devices and writing values to the plurality of metrics in the accelerator scoring catalog based on the monitoring of the accelerators deployed to the plurality of programmable devices, the accelerator manager receiving accelerator scoring criteria, comparing values of the accelerator scoring criteria to corresponding values of the plurality of metrics for the plurality of accelerators, and selecting one of the plurality of accelerators in the accelerator scoring catalog based on the values of the accelerator scoring criteria and the corresponding values of the plurality of metrics, and when the selected one of the plurality of accelerators is currently deployed to one of the plurality of programmable devices, calling the selected one accelerator, and when the selected one of the plurality of accelerators is not currently deployed to any of the plurality of programmable devices, deploying the selected one accelerator to one of the plurality of programmable devices and calling the selected one accelerator.

2. A method for calling an accelerator, the method comprising:

an accelerator manager accessing an accelerator scoring catalog that includes a plurality names of a plurality of accelerators for at least one programmable device and a plurality of metrics for each of the plurality of accelerators, wherein the plurality of metrics for a selected accelerator in the accelerator scoring catalog comprises:

a number of failures of the selected accelerator;

a number of executions of the selected accelerator;

a number of times the selected accelerator has been deployed in a private cloud;

a number of times the selected accelerator has been deployed in a public cloud;

the accelerator manager receiving accelerator scoring criteria that specifies at least one value or range for at least one of the plurality of metrics in the accelerator scoring catalog;

the accelerator manager comparing values of the accelerator scoring criteria to corresponding values of the plurality of metrics for the plurality of accelerators;

the accelerator manager selecting one of the plurality of accelerators in the accelerator scoring catalog based on the values of the accelerator scoring criteria and the corresponding values of the plurality of metrics;

the accelerator manager calling the one selected accelerator;

the accelerator manager monitoring accelerators deployed to the plurality of programmable devices and writing values to the plurality of metrics in the accelerator scoring catalog based on the monitoring of the accelerators deployed to the plurality of programmable devices; and the accelerator manager receiving accelerator scoring criteria, comparing values of the accelerator scoring criteria to corresponding values of the plurality of metrics for the plurality of accelerators, and selecting one of the plurality of accelerators in the accelerator scoring catalog based on the values of the accelerator scoring criteria and the corresponding values of the plurality of metrics, and when the selected one of the plurality of accelerators is currently deployed to one of the plurality of programmable devices, calling the selected one accelerator and when the selected one of the plurality of accelerators is not currently deployed to any of the plurality of programmable devices, deploying the selected one accelerator to one of the plurality of programmable devices and calling the selected one accelerator.

3. The method of claim 2 wherein the plurality of accelerators in the accelerator scoring catalog comprises accelerators deployed in the past to the at least one programmable device but not currently deployed to the at least one programmable device and accelerators currently deployed to the at least one programmable device.

4. The method of claim 2 wherein the accelerator scoring catalog includes entries corresponding to all accelerators deployed in the past and currently deployed to a plurality of programmable devices that includes the at least one programmable device.

5. The method of claim 2 wherein the plurality of metrics for a selected accelerator in the accelerator scoring catalog comprises:

whether the selected accelerator is currently deployed to the programmable device.

6. The method of claim 2 wherein the plurality of metrics for a selected accelerator in the accelerator scoring catalog comprises:

ratings by users;

space utilization and efficiency; and at least one code metric for at least one computer program that called the selected accelerator.

7. The method of claim 2 wherein the plurality of metrics for a selected accelerator in the accelerator scoring catalog comprises:

power consumption for the selected accelerator; and speed of the selected accelerator.

8. The method of claim 2 wherein the plurality of metrics for a selected accelerator in the accelerator scoring catalog comprises:

image characteristics of the selected accelerator, including:

space used on the programmable device;

resources used on the programmable device; and use of dedicated functions on the programmable device.

* * * * *